(12) United States Patent
Yu

(10) Patent No.: US 12,100,773 B2
(45) Date of Patent: Sep. 24, 2024

(54) AVALANCHE PHOTODIODE STRUCTURE

(71) Applicant: ROCKLEY PHOTONICS LIMITED, Altrincham (GB)

(72) Inventor: Guomin Yu, Glendora, CA (US)

(73) Assignee: Rockley Photonics Limited, Altrincham (GB)

( * ) Notice: Subject to any disclaimer, the term of this patent is extended or adjusted under 35 U.S.C. 154(b) by 439 days.

(21) Appl. No.: 17/573,589

(22) Filed: Jan. 11, 2022

(65) Prior Publication Data

US 2022/0140157 A1   May 5, 2022

Related U.S. Application Data

(63) Continuation-in-part of application No. 16/613,739, filed as application No. PCT/EP2018/062519 on May 15, 2018, now Pat. No. 11,508,868.

(30) Foreign Application Priority Data

May 15, 2017   (GB) ...................................... 1707754

(51) Int. Cl.
*H01L 31/02* (2006.01)
*G02B 6/122* (2006.01)
(Continued)

(52) U.S. Cl.
CPC ........ *H01L 31/02327* (2013.01); *G02B 6/122* (2013.01); *G02B 6/131* (2013.01);
(Continued)

(58) Field of Classification Search
CPC ............. H01L 31/02327; H01L 31/028; H01L 31/107; H01L 31/1808; H01L 31/1075;
(Continued)

(56) References Cited

U.S. PATENT DOCUMENTS

| 7,082,248 B1 * | 7/2006 | Morse ................ G02B 6/12004 |
| | | 385/131 |
| 7,209,623 B2 | 4/2007 | Morse |
| | (Continued) | |

FOREIGN PATENT DOCUMENTS

| CN | 1858916 A | 11/2006 |
| CN | 104247046 A | 12/2014 |
| WO | WO 2017/023301 A1 | 2/2017 |

OTHER PUBLICATIONS

Huang, M. et al., "Recess-type waveguide integrated germanium on silicon avalanche photodiode", OFC, 2021, 3 pages, OSA.
(Continued)

*Primary Examiner* — S M Sohel Imtiaz
(74) *Attorney, Agent, or Firm* — Lewis Roca Rothgerber Christie LLP

(57) ABSTRACT

A germanium based avalanche photo-diode device and method of manufacture thereof. The device including: a silicon substrate; a lower doped silicon region, positioned above the substrate; a silicon multiplication region, positioned above the lower doped silicon region; an intermediate doped silicon region, positioned above the silicon multiplication region; a doped germanium interface layer, positioned above the intermediate doped silicon region; an un-doped germanium absorption region, position above the doped germanium interface layer; an upper doped germanium region, positioned above the un-doped germanium absorption region; and an input silicon waveguide; wherein: the un-doped germanium absorption region and the upper doped germanium region form a germanium waveguide which is coupled to the input waveguide, and the device also includes a first electrode and a second electrode, and the first electrode extends laterally to contact the lower doped silicon
(Continued)

region and the second electrode extends laterally to contact the upper doped germanium region.

20 Claims, 36 Drawing Sheets

(51) Int. Cl.
G02B 6/13 (2006.01)
G02B 6/136 (2006.01)
H01L 31/0232 (2014.01)
H01L 31/028 (2006.01)
H01L 31/107 (2006.01)
H01L 31/18 (2006.01)
G02B 6/12 (2006.01)

(52) U.S. Cl.
CPC ............ *G02B 6/136* (2013.01); *H01L 31/028* (2013.01); *H01L 31/107* (2013.01); *H01L 31/1808* (2013.01); *G02B 2006/12061* (2013.01); *G02B 2006/12097* (2013.01)

(58) Field of Classification Search
CPC ........ G02B 6/122; G02B 6/131; G02B 6/136; G02B 2006/12061; G02B 2006/12097
See application file for complete search history.

(56) References Cited

U.S. PATENT DOCUMENTS

| | | |
|---|---|---|
| 9,219,184 B2 | 12/2015 | Huang et al. |
| 9,287,432 B2 | 3/2016 | Shi et al. |
| 9,299,864 B2 | 3/2016 | Shi et al. |
| 9,780,248 B2 | 10/2017 | Huang et al. |
| 2012/0001284 A1* | 1/2012 | Tut ........................ H01L 31/105 257/432 |
| 2013/0071058 A1* | 3/2013 | Lim ........................ G02F 1/025 385/2 |
| 2014/0151839 A1 | 6/2014 | Kang et al. |
| 2014/0231946 A1* | 8/2014 | Kang .................... H01L 31/107 257/432 |
| 2015/0001581 A1* | 1/2015 | Oda ..................... H01L 31/1075 257/186 |
| 2015/0097256 A1 | 4/2015 | Ang et al. |
| 2015/0293384 A1* | 10/2015 | Ogawa .................. G02B 6/1228 385/2 |
| 2015/0340538 A1* | 11/2015 | Novack ........... H01L 31/035281 250/214 A |
| 2016/0126381 A1* | 5/2016 | Wang ..................... G02B 6/122 257/429 |
| 2016/0204298 A1* | 7/2016 | Chen ................. H01L 31/02327 257/432 |
| 2016/0351743 A1* | 12/2016 | Yu ....................... G02B 6/12004 |
| 2018/0219120 A1* | 8/2018 | Huang ............. H01L 31/02327 |
| 2021/0175384 A1 | 6/2021 | Yu |

OTHER PUBLICATIONS

Huang, Z. et al., "Low-voltage Si—Ge avalanche photodiode", Apr. 6, 2015, 3 pages, Hewlett-Packard Development Company, L.P.
International Search Report and Written Opinion of the International Searching Authority, Mailed Jul. 17, 2018, Corresponding to PCT/EP2018/062519, 14 pages.
Kang, Yimin et al., "Monolithic germanium/silicon avalanche photodiodes with 340 GHz gain-bandwidth product", Nature Photonics, Dec. 7, 2008, pp. 59-63, vol. 3, Macmillan Publishers Limited.
U.K. Intellectual Property Office Search and Examination Report, dated Oct. 30, 2017, for Patent Application No. GB 1707754.6, 8 pages.
U.S. Office Action from U.S. Appl. No. 16/613,739, dated Sep. 23, 2021, 21 pages.
Vivien, Laurent et al., "Handbook of Silicon Photonics", 2013, 6 pages, Taylor and Francis.
Chinese Notification of the First Office Action, for Patent Application No. 201880004525.9, mailed Aug. 12, 2022, 8 pages.
Partial English translation of the Chinese Notification of the First Office Action, for Patent Application No. 201880004525.9, mailed Aug. 12, 2022, 14 pages.
U.S. Notice of Allowance from U.S. Appl. No. 16/613,739, dated Apr. 1, 2022, 15 pages.

* cited by examiner

FIG. 6A(ii)

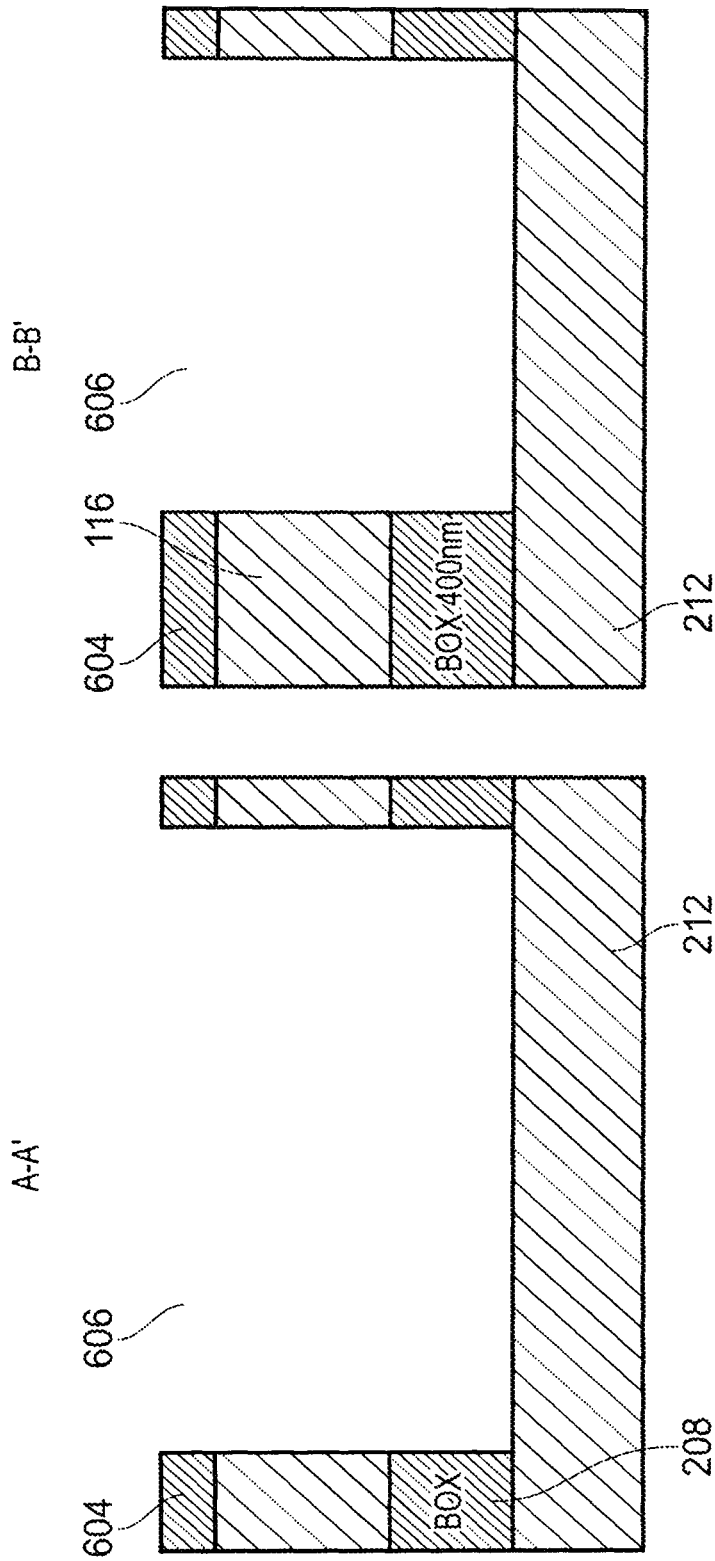

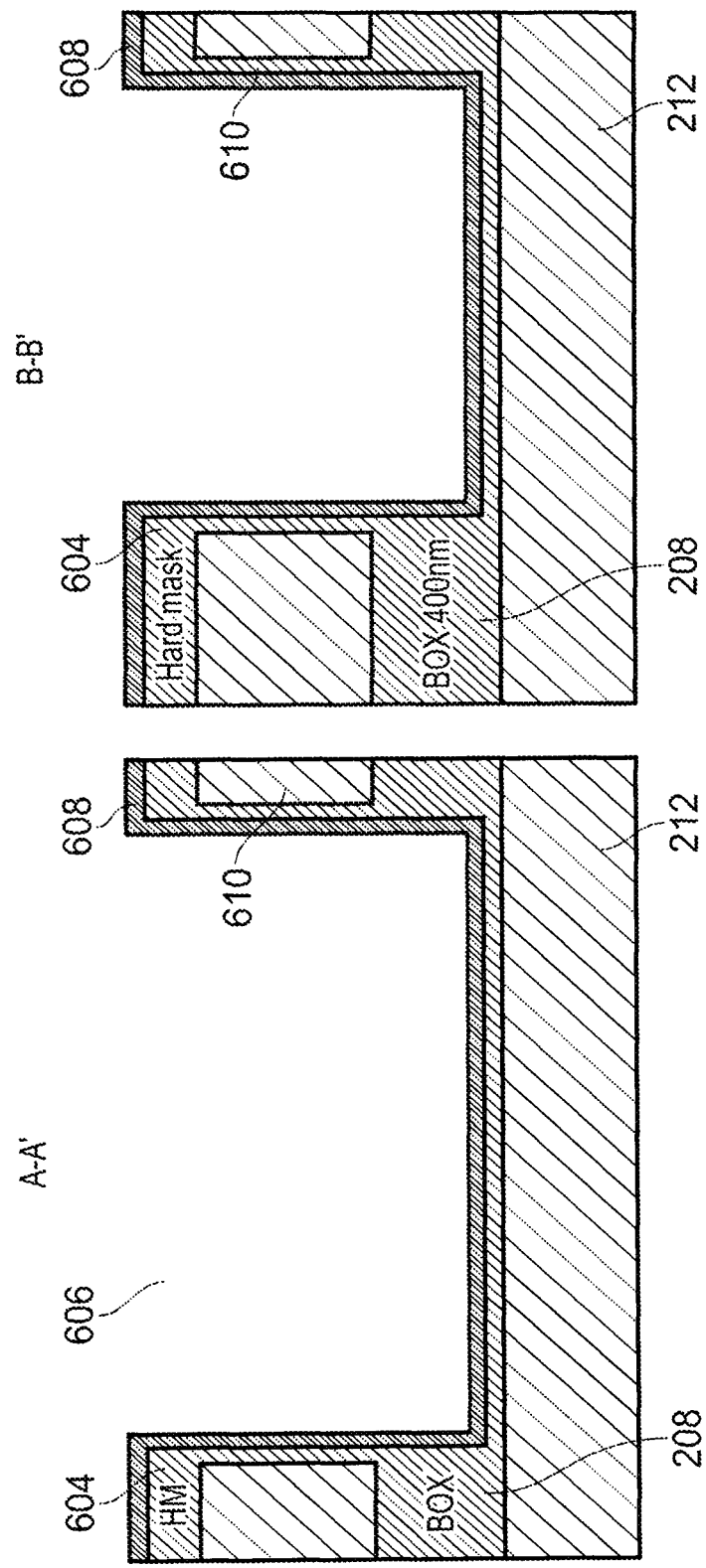

FIG. 6D(ii)

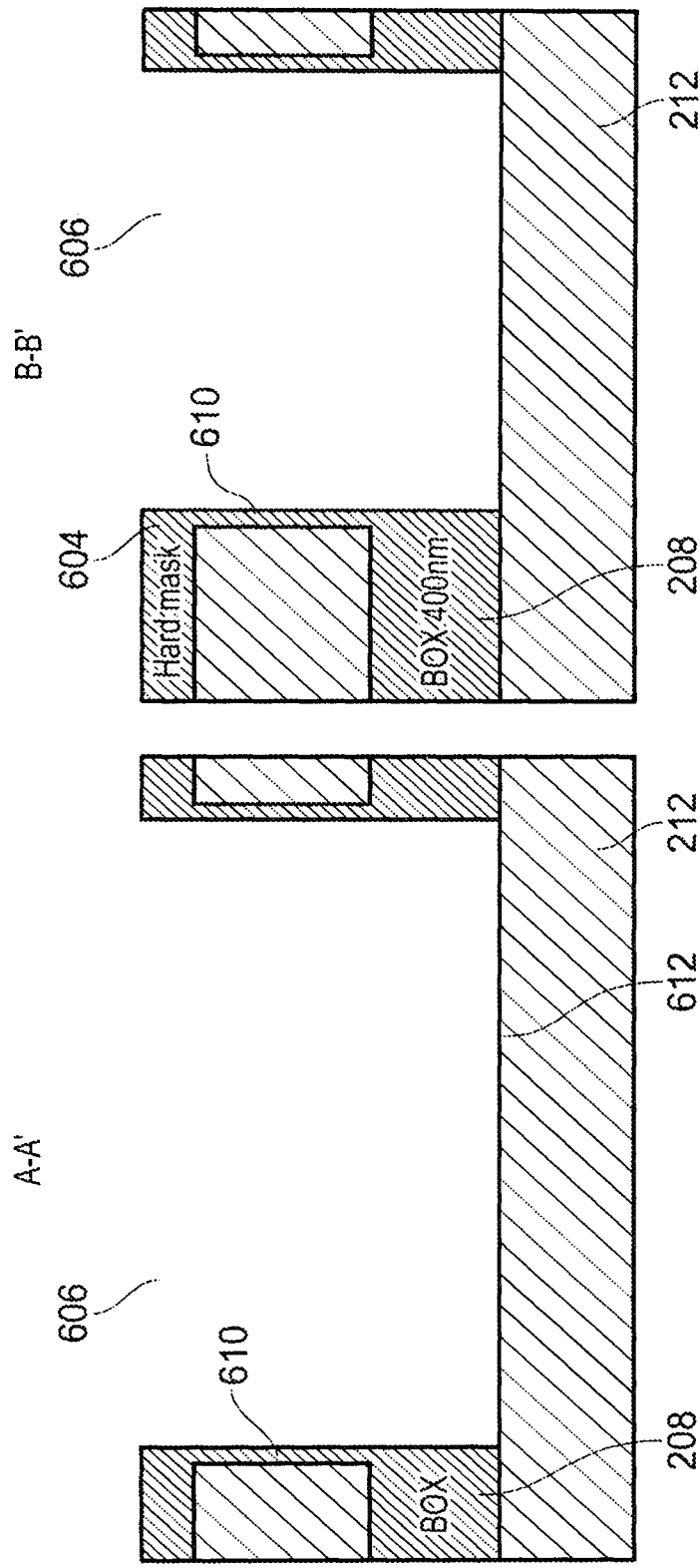

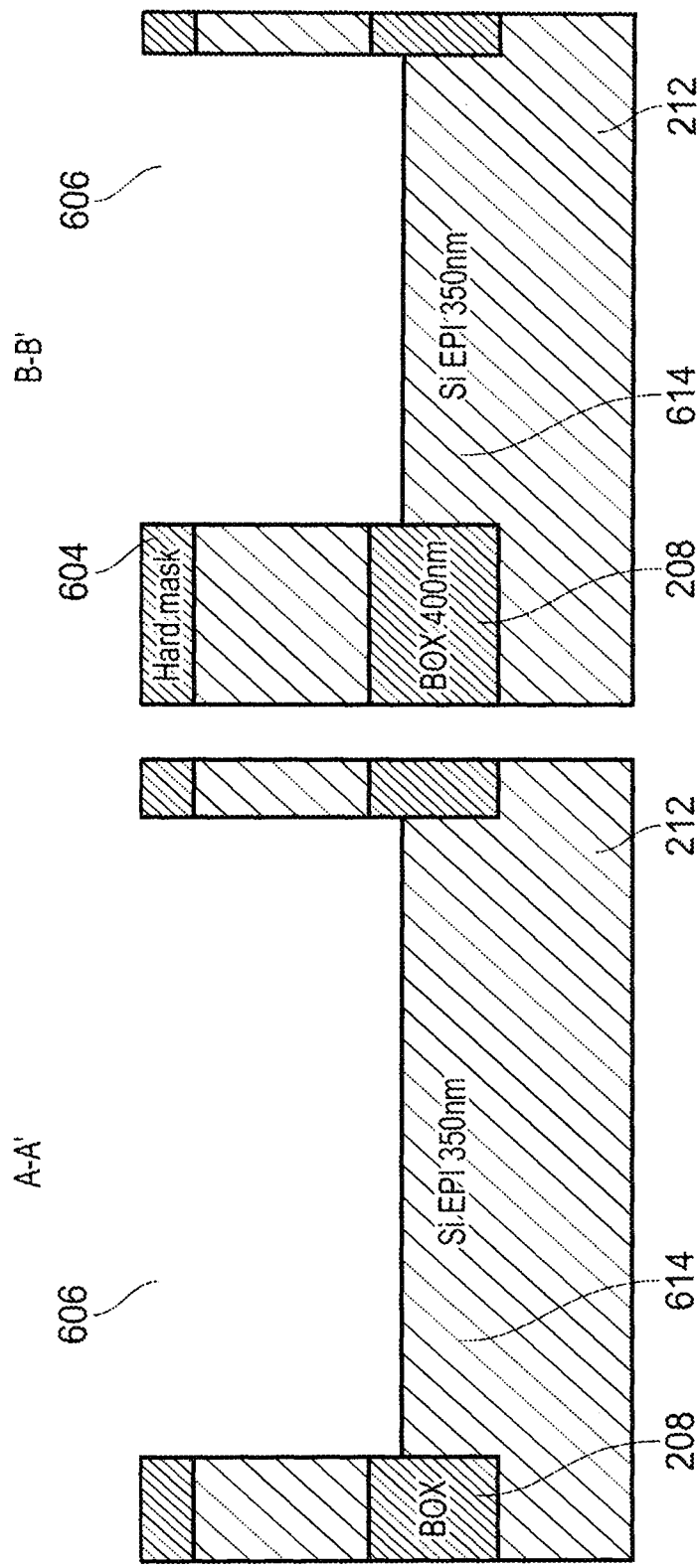

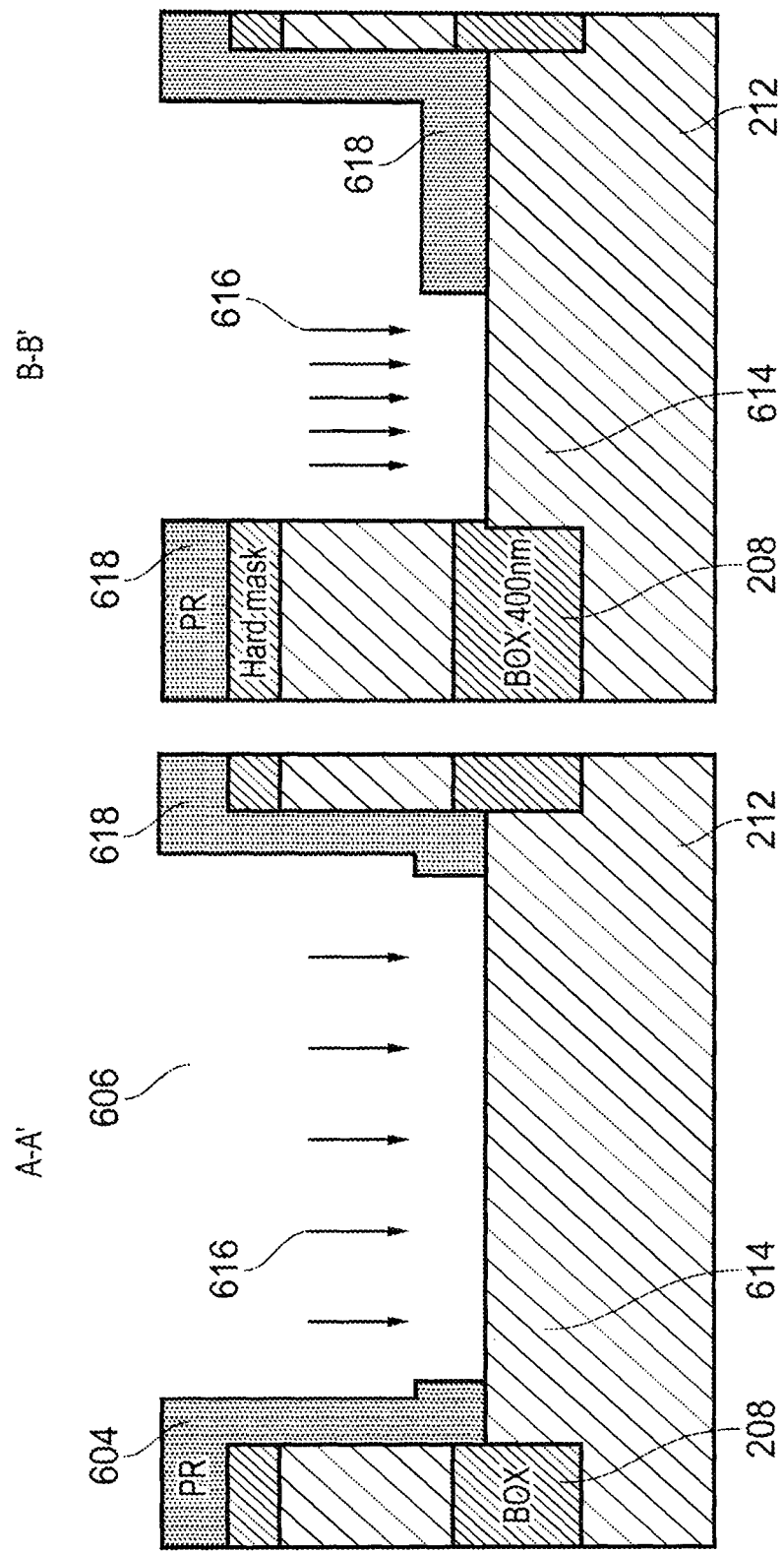

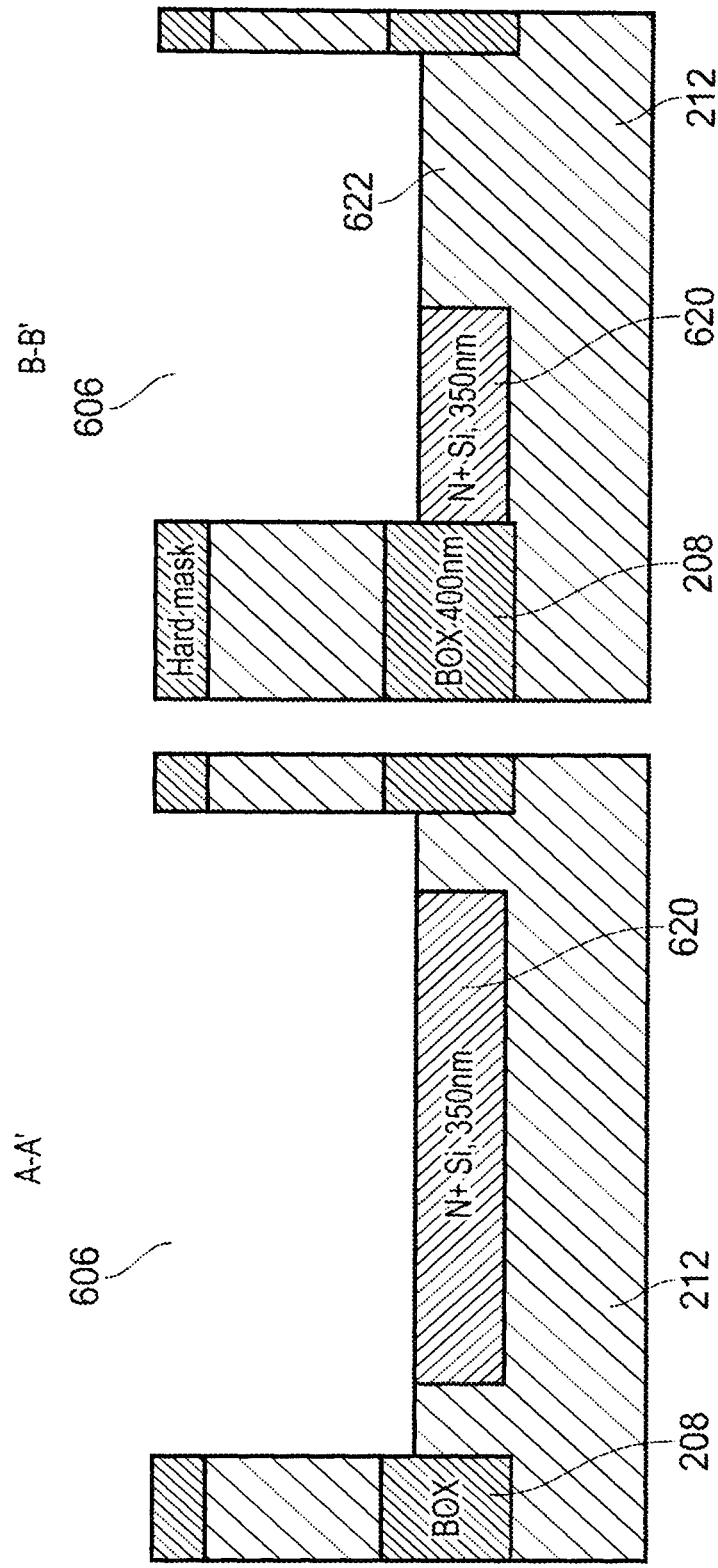

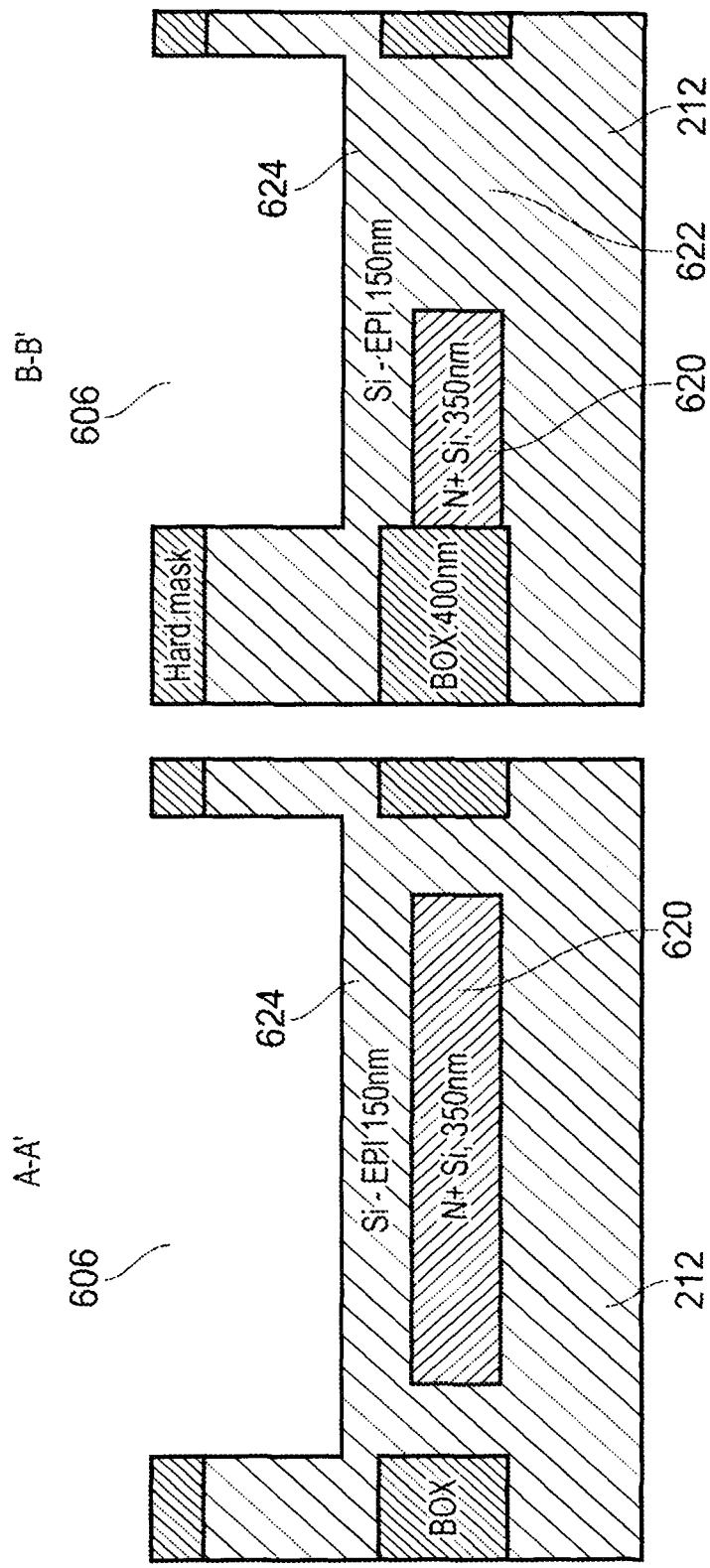

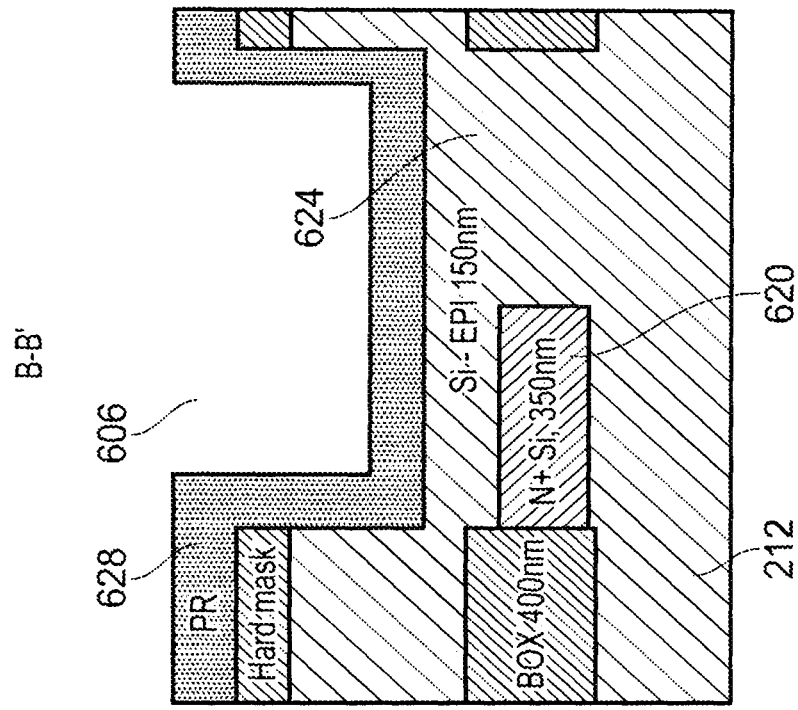
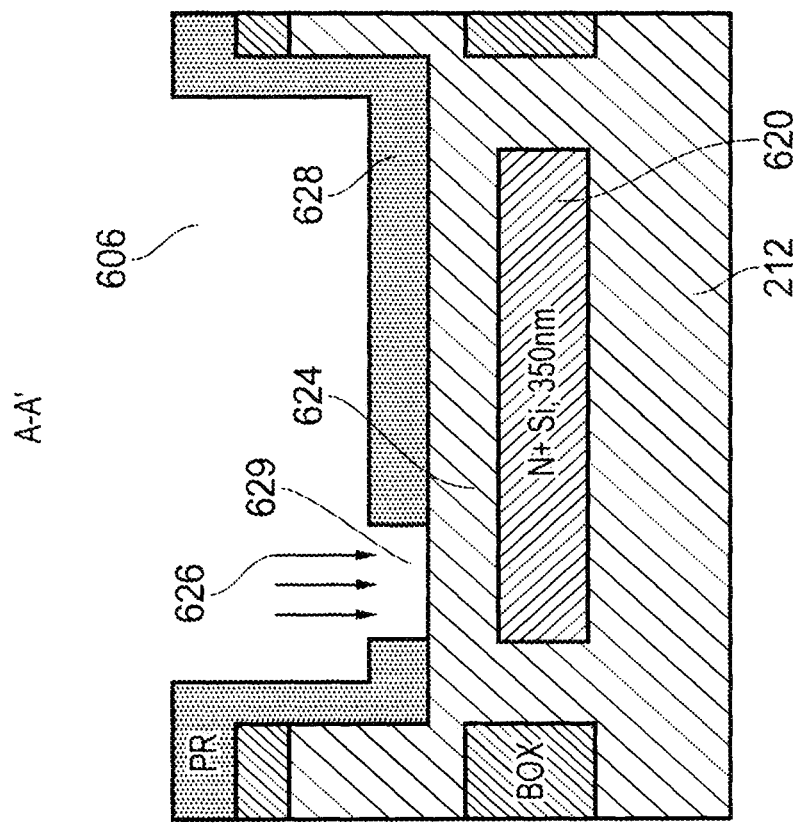

FIG. 6K(ii)

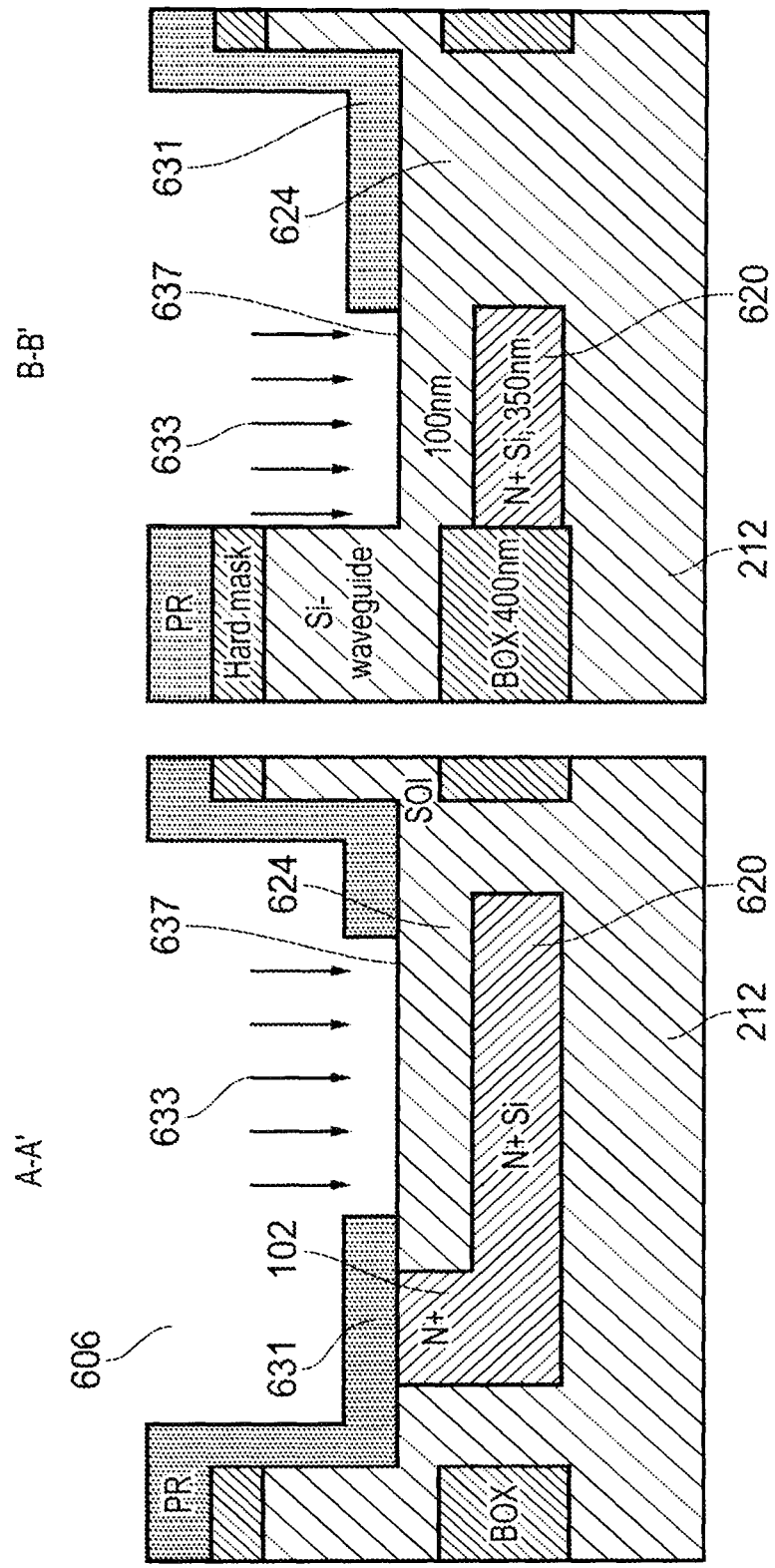

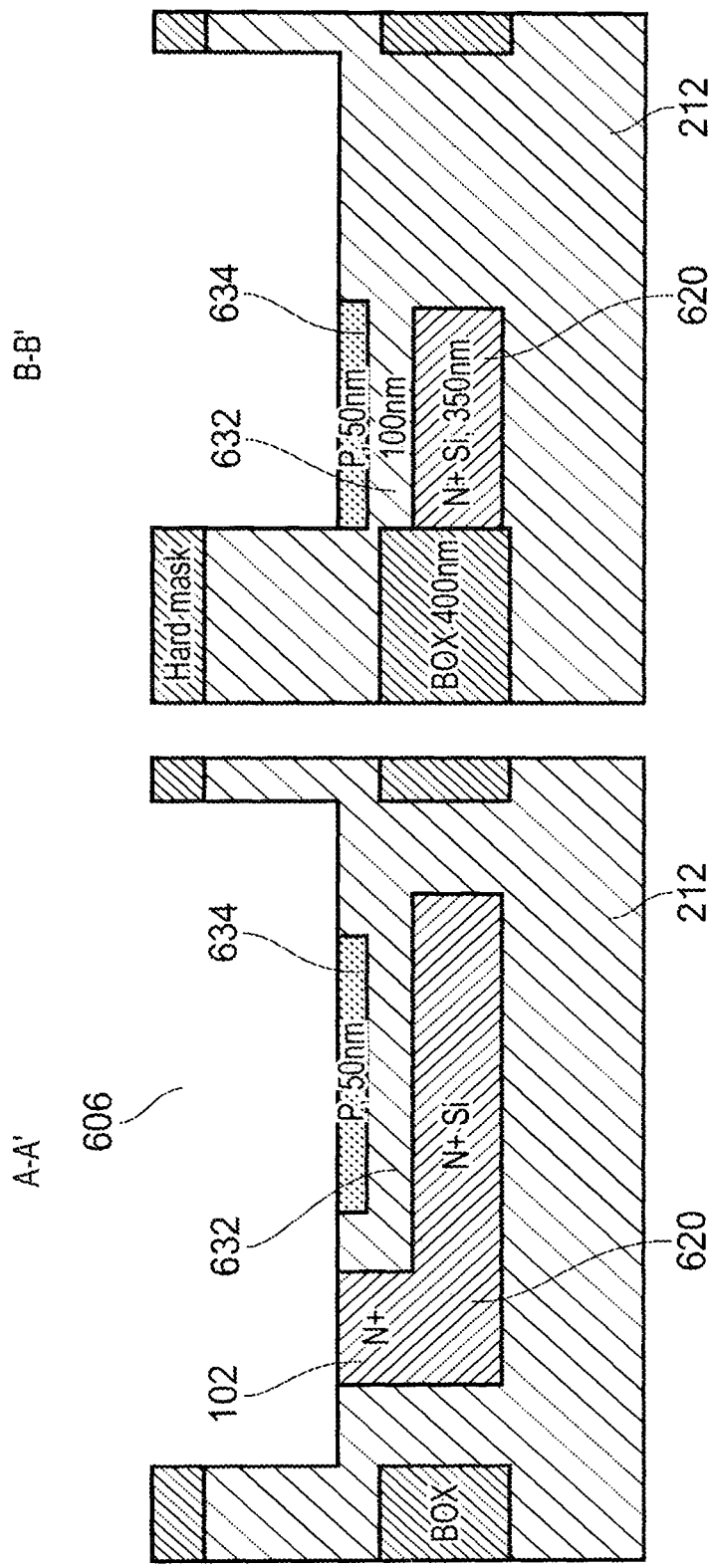

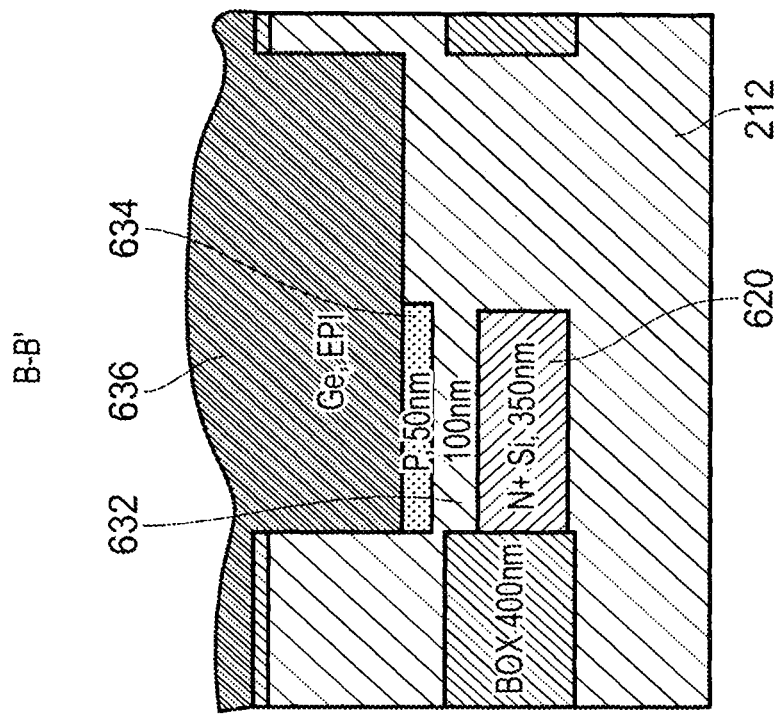
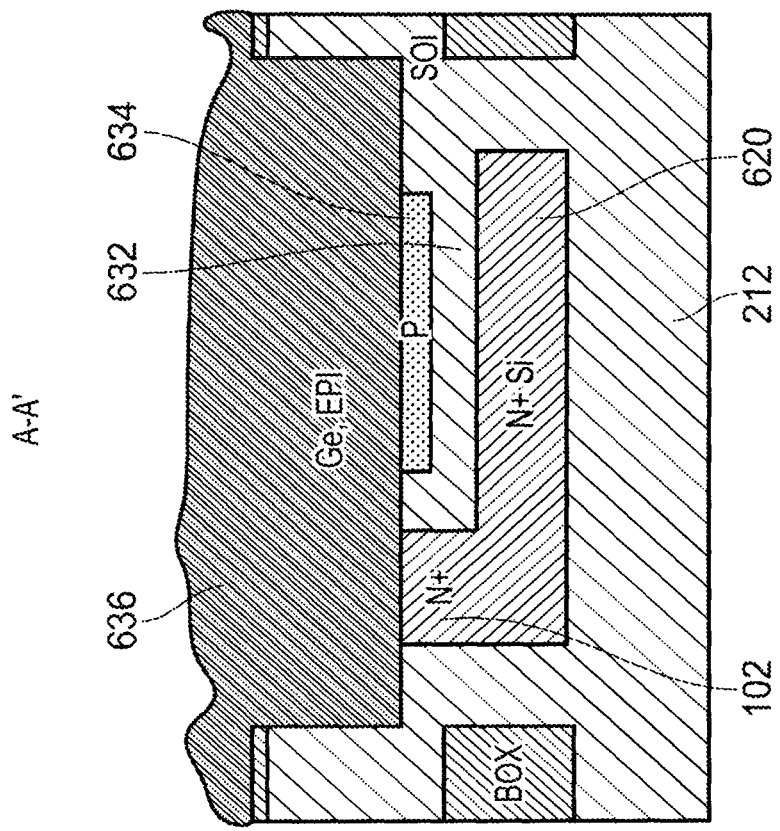

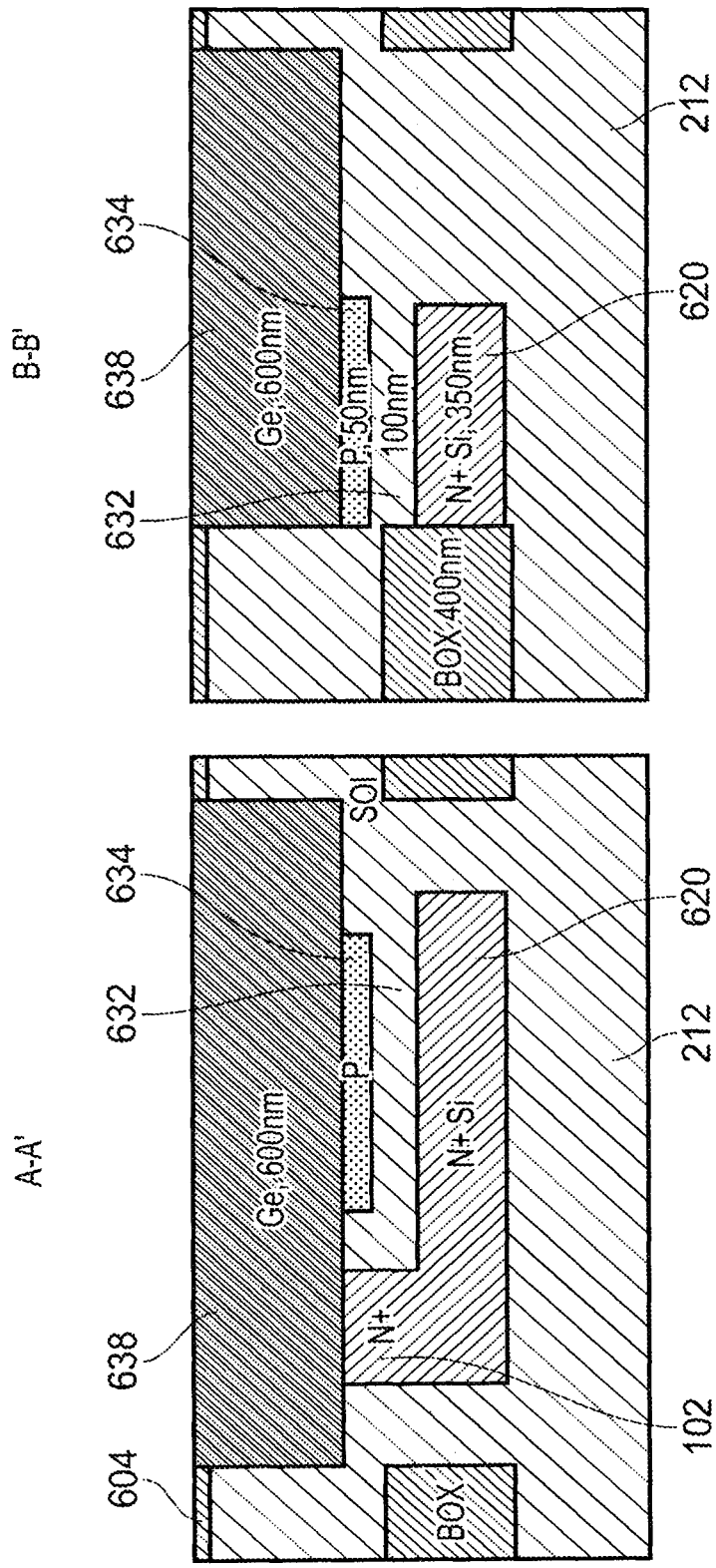

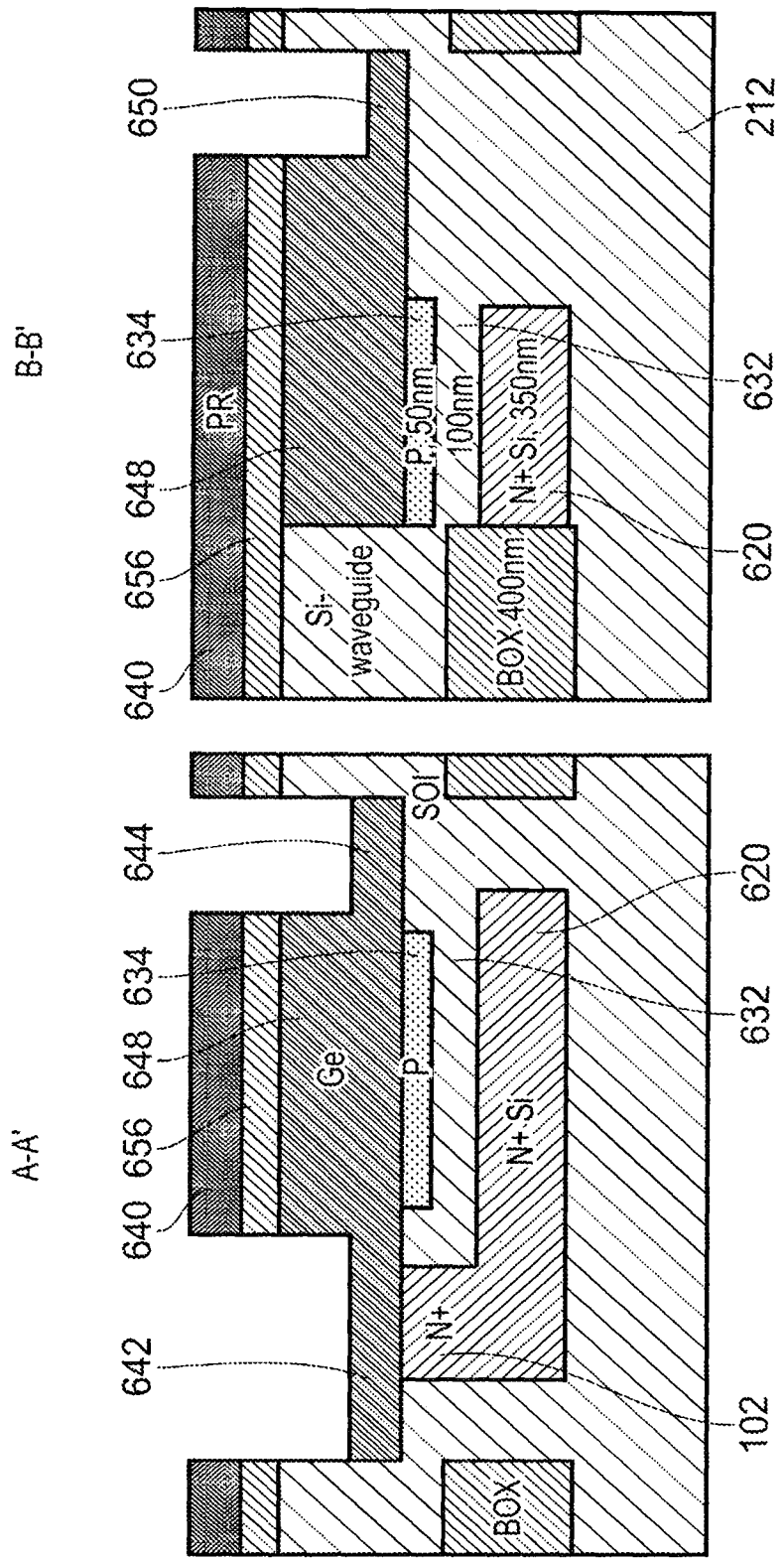

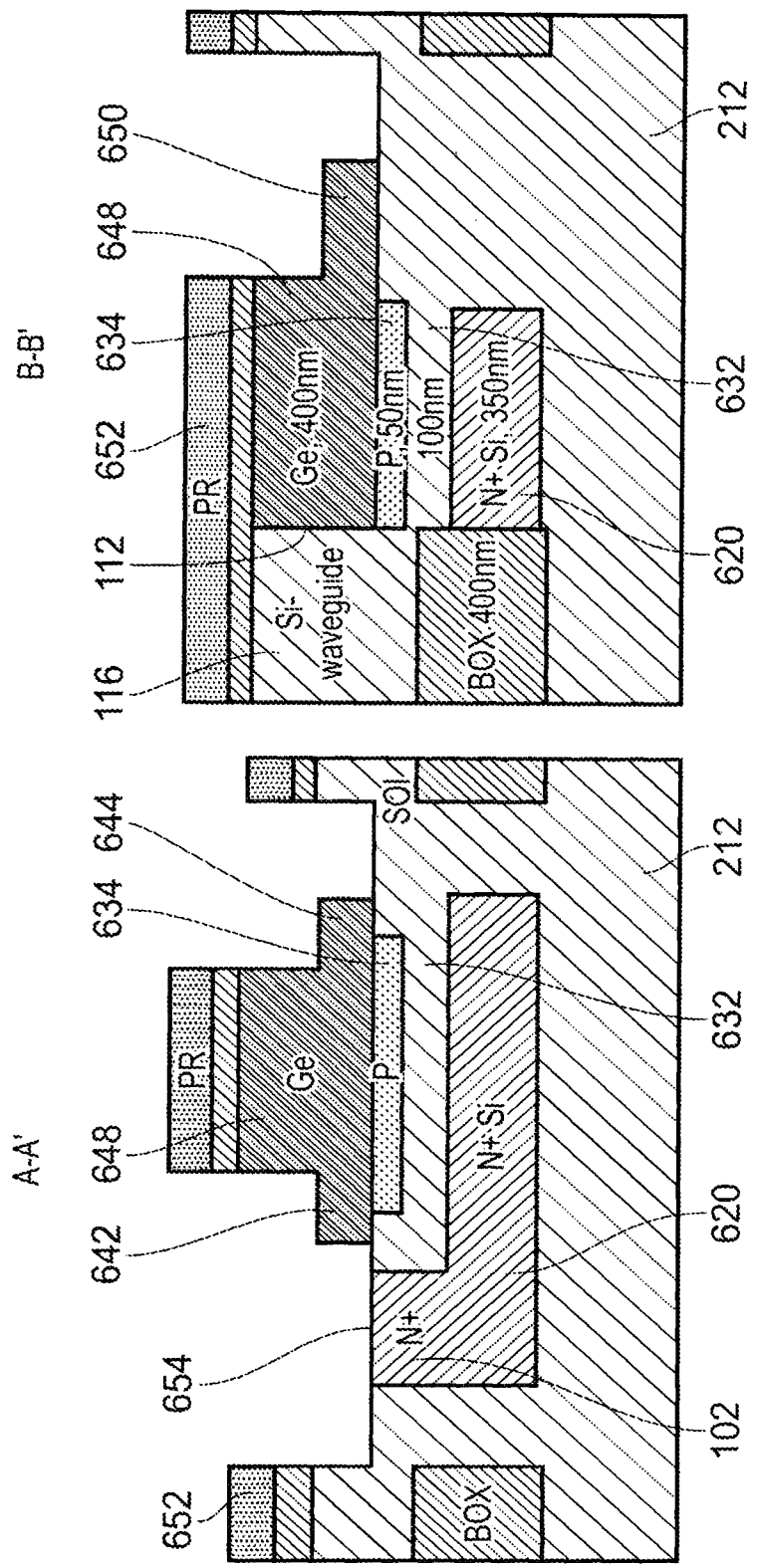

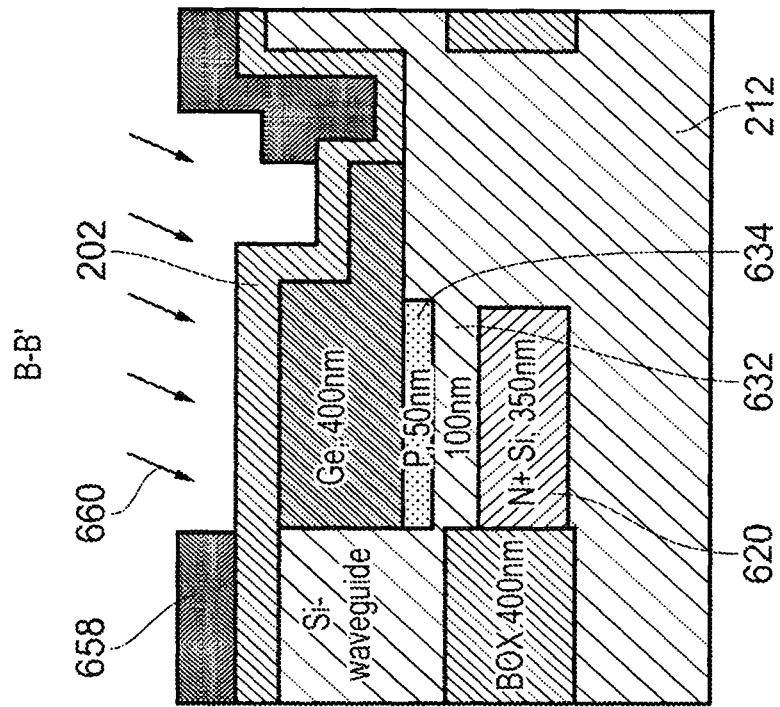
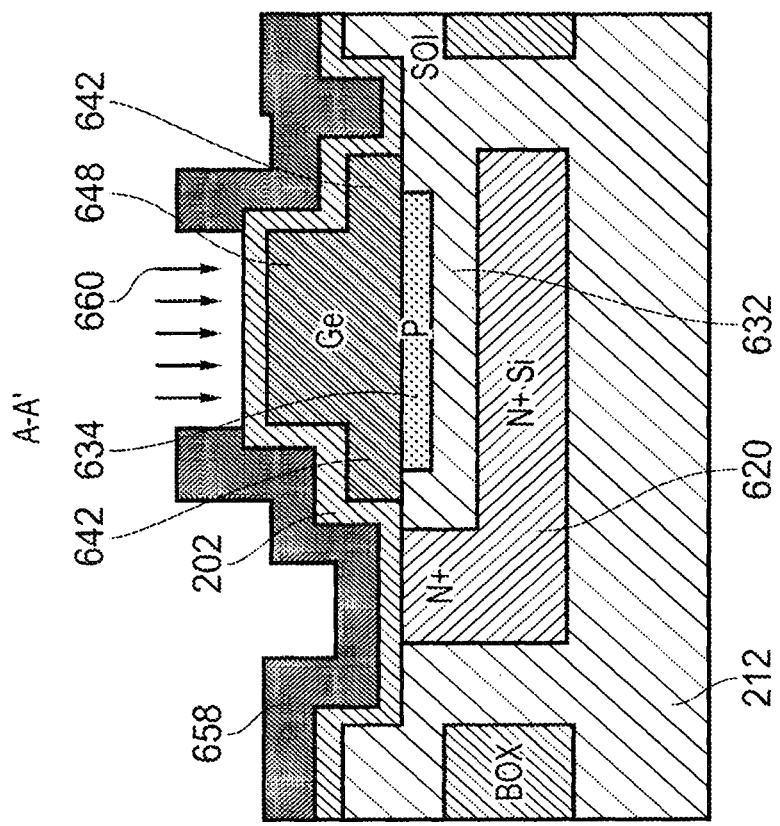

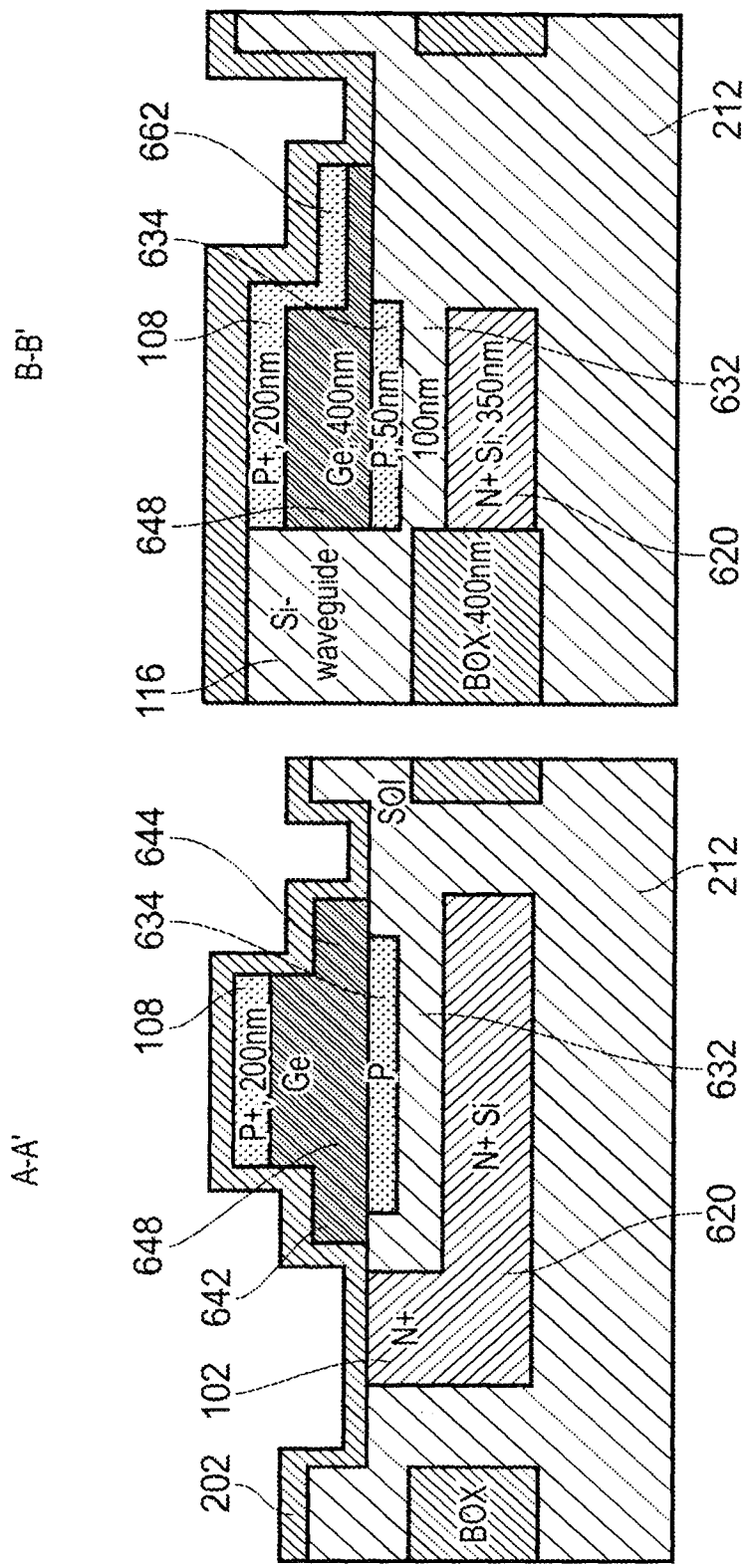

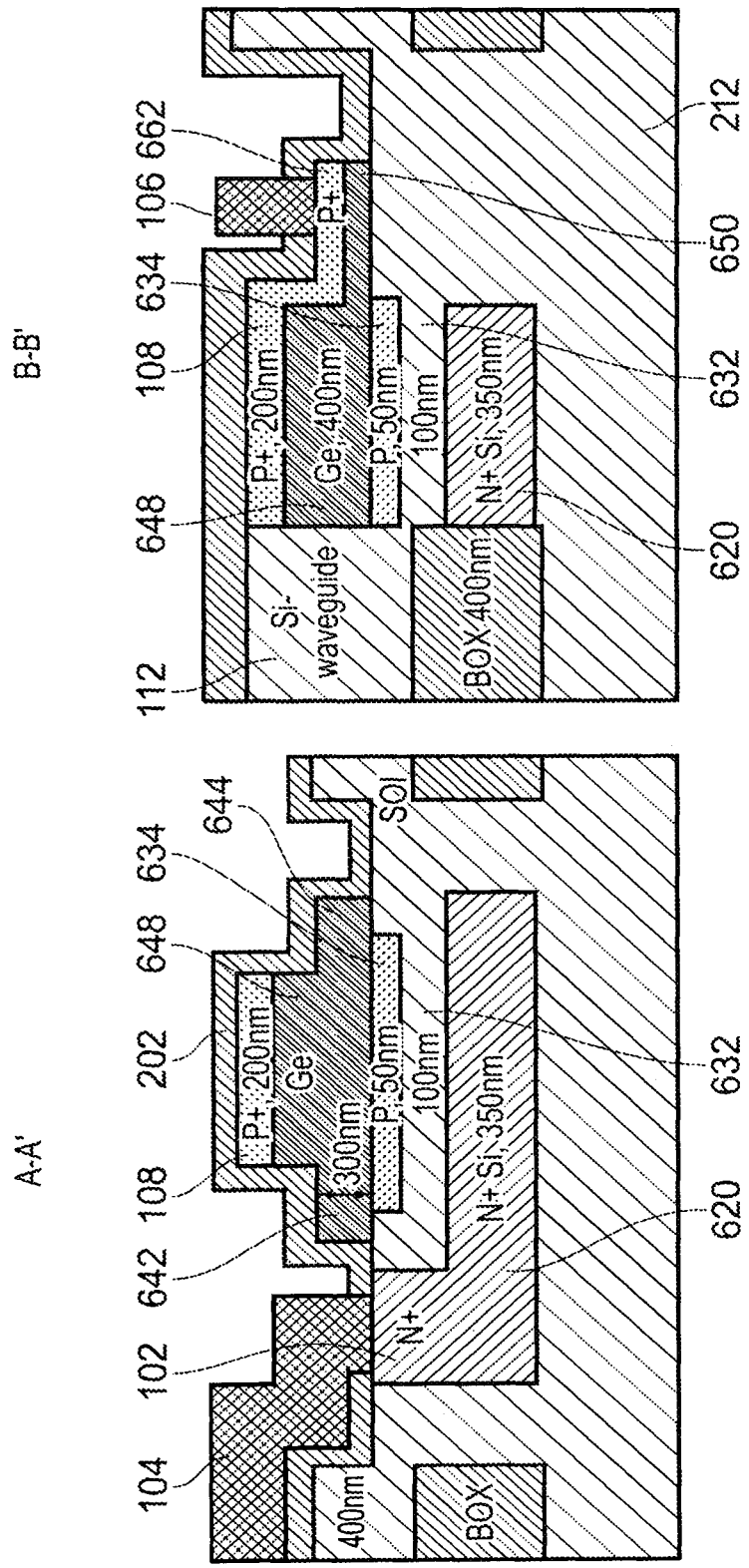

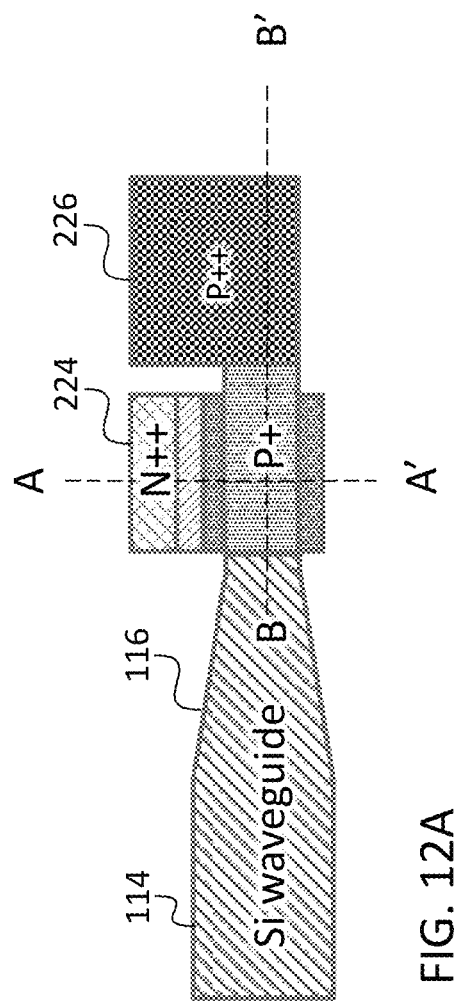
FIG. 12A
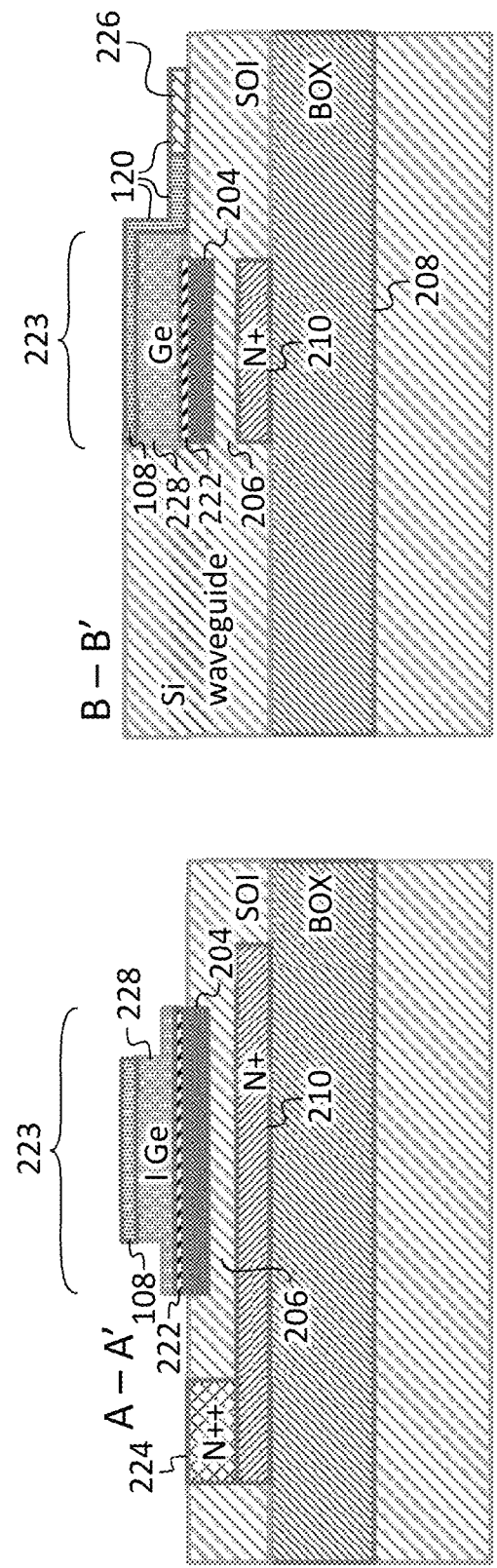
FIG. 12C
FIG. 12B

AVALANCHE PHOTODIODE STRUCTURE

CROSS-REFERENCE TO RELATED APPLICATION(S)

The present application is a continuation-in-part of U.S. application Ser. No. 16/613,739 filed Nov. 14, 2019, entitled "AVALANCHE PHOTODIODE STRUCTURE", which is a National Stage Entry of International Patent Application No. PCT/EP2018/062519, filed May 15, 2018, which claims priority to United Kingdom Patent Application No. 1707754.6, filed May 15, 2017; the entire contents of all of the applications identified in this paragraph are incorporated herein by reference.

FIELD

One or more aspects of embodiments according to the present disclosure relate to avalanche photodiodes, and more particularly to avalanche photodiodes based on germanium.

BACKGROUND

Optical communication links seem apt for replacing the traditional electronic transmission lines in high speed interconnects, such as those used in data centres. One major challenge however in the widespread uptake of optical communication links is the improvement of the total power efficiency of the link. One device which may prove useful in improving the power efficiency of a link is the avalanche photodiode (APD).

The avalanche photodiode is a sensitive semi-conductive electronic device, which exploits the photo-electronic effect to convert light into electricity. Generally, avalanche photodiodes can be thought of as providing gain through avalanche multiplication. Avalanche breakdown is a phenomenon in which, through the application of an electric field, charge carriers cause the production of other charge carriers within a multiplication region of a device.

However, the deployment of conventional avalanche photodiodes in optical communication systems requires high bias voltages. For example, conventional avalanche photodiodes require a bias voltage of >25V. It is desirable to have a lower bias voltage for optical communication systems so as to reduce power consumption. Furthermore, the fabrication of an avalanche photodiode on a scale useable for optical electronics (i.e. within an optical circuit) may be problematic and fraught with difficulties.

SUMMARY

Accordingly, in a first aspect, the invention provides: a germanium based avalanche photo-diode device, the device including:
 a silicon substrate;
 a lower doped silicon region, positioned above the silicon substrate;
 a silicon multiplication region, positioned above the lower doped silicon region;
 an intermediate doped silicon region, positioned above the silicon multiplication region;
 an un-doped germanium absorption region, positioned above the intermediate doped silicon region;
 an upper doped germanium region, positioned above the un-doped germanium absorption region; and
 an input silicon waveguide;
 wherein: the un-doped germanium absorption region and the upper doped germanium region form a germanium waveguide which is coupled to the input silicon waveguide with substantially aligned top surface, and
 the device also includes a first electrode and a second electrode, and the first electrode extends laterally to contact the lower doped silicon region and the second electrode extends laterally to contact the upper doped germanium region.

By lateral, it may be meant a direction which extends parallel to the surface of the substrate. By waveguide, it may be meant a region of the device which confines an optical mode of light contained therein. The germanium waveguide may be referred to as a germanium guiding region. The germanium waveguide may be a rib waveguide, comprising a rib and slab, which may both be butt coupled to the input silicon waveguide with the top surface substantially aligned.

Advantageously, by providing lower and upper doped regions, with a multiplication and intermediate doped region disposed therebetween, the operating voltage may be reduced in comparison to the related art. Moreover, provision of first and second electrodes which extend laterally to contact their respective doped regions may result in a device which is easier to manufacture.

In a second aspect, the invention provides a method of fabricating a germanium based avalanche photodiode device, comprising:
 providing a silicon substrate and an insulator layer, above which is a silicon-on-insulator layer;
 etching the silicon-on-insulator layer and the insulator layer, to form a cavity of the silicon-on-insulator layer which extends to the substrate;
 epitaxially growing a silicon layer from a bed of the cavity;
 doping the grown silicon layer to form a lower doped region;
 growing a further silicon layer from an upper surface of the lower doped region;
 doping a first part of the further silicon layer to form an intermediate doped region;
 epitaxially growing a germanium layer from an upper surface of the further silicon layer to form a waveguide;
 doping a part of the germanium layer to form an upper doped region;
 providing a first electrode and a second electrode, the first electrode contacting the lower doped silicon region and the second electrode contacting the upper doped germanium region.

By epitaxially growing, it may be meant that the silicon layer and/or germanium layer may be grown via selective area epitaxy.

Optional features of the invention will now be set out. These are applicable singly or in any combination with any aspect of the invention.

The lower doped silicon region may include a part which extends away from the substrate so as to contact the first electrode. The lower doped silicon region may be horizontally aligned with a buried oxide layer of the device. The lower doped silicon region may be directly adjacent to the substrate.

The upper doped germanium region may include a part which extends towards the substrate so as to contact the second electrode. This part may extend from a portion of the upper doped germanium region which is distal to the substrate to a portion of the upper doped germanium region which is proximal to the substrate. This part may also extend parallel to the substrate. The second electrode may contact the upper doped germanium region at a part of the upper doped germanium region which is distal to the input silicon waveguide. The second electrode may contact the upper doped germanium region at a part of the upper doped germanium region which is not an uppermost surface thereof. The second electrode may contact the upper doped germanium region at a slab portion of the germanium waveguide.

The upper doped germanium region may be immediately adjacent to the waveguide, or may be part of the germanium waveguide.

The germanium waveguide and the silicon waveguide may be rib waveguides. The germanium waveguide may be disposed immediately adjacent to the intermediate doped region, on an opposing side of the intermediate doped silicon region to the lower doped silicon region. The multiplication region may include the silicon region between the intermediate doped silicon region and the lower doped silicon region.

The germanium waveguide may have a first lateral edge, and the lower doped silicon region may be coterminous in lateral extension with the first lateral edge of the germanium waveguide.

The germanium waveguide may have a first lateral edge, and the lower doped silicon region may extend laterally beyond the first lateral edge of the germanium waveguide.

The multiplication silicon region, germanium waveguide, and intermediate doped silicon region may be within a cavity of a silicon-on-insulator layer.

The multiplication silicon region may be between 50 nm and 150 nm thick. In other examples, the multiplication silicon region may be between 75 nm and 125 nm thick. In yet further examples, the multiplication silicon region is 100 nm thick. Where 'thickness' of a region or layer is referred to, it may be that the term refers to the absolute height of the device (i.e. to what extent it extends vertically). Advantageously, a multiplication silicon region with such dimensions has a lower operating voltage than related art examples (for example, the operating voltage may be on the order of 10 V).

The upper doped germanium region and the lower doped silicon region may be heavily doped as compared to the intermediate doped region. For example, the concentration of dopants in the upper and lower region may be a factor of 10 or more greater than the concentration of dopants in the intermediate doped region.

The intermediate doped region may be doped with dopants of a same species as the upper doped region.

The fabrication method may include a step of: after etching the device and before epitaxially growing the silicon layer: disposing an insulating layer along sidewalls and the bed of the cavity. The fabrication method may further include the step of: etching the insulating layer which along the bed of the cavity, thereby leaving an insulating layer along the sidewalls of the cavity.

The fabrication method may include a step of: doping a region of the silicon layer grown from the bed of the cavity.

The fabrication method may include a step of in-situ doping the silicon layer grown from the bed of the cavity during the step of epitaxially growing the silicon layer from a bed of the cavity.

The fabrication method may include the step of: before doping the grown silicon layer: disposing a first photoresist over a part of the grown silicon layer; and, after doping the grown silicon layer: removing the first photoresist.

The fabrication method may include the step of: before doping the further silicon layer: disposing a second photoresist over a part of the further silicon layer; and, after doping the further silicon layer: removing the second photoresist.

The fabrication method may include a step of: etching a part of the waveguide, to thereby provide a rib waveguide having one or more slab regions.

The fabrication method may include a step of: before doping the part of the germanium layer: disposing a photoresist over a part of an upper most surface of the device; and after doping the part of the germanium layer: removing the photoresist.

The fabrication method may include a step of annealing the device.

The fabrication method may include a step of disposing a cladding layer over the device.

According to an embodiment of the present disclosure, there is provided a germanium based avalanche photodiode device, the germanium based avalanche photodiode device including: a silicon substrate; a buried oxide layer, above the silicon substrate; a lower doped silicon region, above the buried oxide layer; a silicon multiplication region, above the lower doped silicon region; an intermediate doped silicon region, above the silicon multiplication region; a doped germanium interface layer; above the intermediate doped silicon region; an un-doped germanium absorption region, above the intermediate doped silicon region; an upper doped germanium region, above the un-doped germanium absorption region; an input silicon waveguide; a first electrode; and a second electrode, wherein: the un-doped germanium absorption region and the upper doped germanium region form a germanium waveguide which is coupled to the input silicon waveguide, the first electrode extends laterally to contact the lower doped silicon region, and the second electrode extends laterally to contact the upper doped germanium region.

In some embodiments, the doped germanium interface layer has a thickness between 30 nm and 200 nm.

In some embodiments, the lower doped silicon region includes a part which extends away from the buried oxide layer so as to contact the first electrode.

In some embodiments, the input silicon waveguide and germanium waveguide are rib waveguides.

In some embodiments, the germanium waveguide has a first lateral edge, and the lower doped silicon region is coterminous in lateral extension with the first lateral edge of the germanium waveguide.

In some embodiments, the germanium waveguide has a first lateral edge, and the lower doped silicon region extends laterally beyond the first lateral edge of the germanium waveguide.

In some embodiments, the multiplication silicon region, the germanium waveguide, and the intermediate doped silicon region are within a cavity of a silicon-on-insulator layer.

In some embodiments, the multiplication silicon region is between 50 nm and 150 nm thick.

In some embodiments, the upper doped germanium region and the lower doped silicon region are heavily doped as compared to the intermediate doped silicon region.

In some embodiments, the intermediate doped silicon region is doped with dopants of a same species as the upper doped germanium region.

In some embodiments, a top surface of the input silicon waveguide is substantially aligned with a top surface of the germanium waveguide.

According to an embodiment of the present disclosure, there is provided a method of fabricating a germanium based avalanche photodiode device, including: providing a silicon substrate and an insulator layer, above which is a silicon-on-insulator layer; etching the silicon-on-insulator layer, to form a cavity of the silicon-on-insulator layer the bottom of which includes a first silicon layer on the insulator layer; doping the first silicon layer to form a lower doped silicon region; growing a second silicon layer from an upper surface of the lower doped silicon_region; doping a first part of the second silicon layer to form an intermediate doped silicon_ region; epitaxially growing a germanium layer from an upper surface of the second silicon layer to form a germanium waveguide, the growing including using in-situ doping to form a doped germanium interface layer on the intermediate doped silicon region; doping a part of the germanium layer to form an upper doped germanium region; and providing a first electrode and a second electrode, the first electrode contacting the lower doped silicon region and the second electrode contacting the upper doped germanium region.

In some embodiments, the method further includes a step of: after etching the silicon-on-insulator layer and before epitaxially growing the first silicon layer: disposing an insulating layer along sidewalls and the bed of the cavity.

In some embodiments, the method includes the step of: etching the insulating layer which is along the bed of the cavity, thereby leaving an insulating layer along the sidewalls of the cavity.

In some embodiments, the method includes the step of doping a region of the first silicon layer.

In some embodiments, the doped germanium interface layer has a thickness between 30 nm and 200 nm.

In some embodiments, the method includes the step of: etching a part of the germanium layer, to thereby provide a rib waveguide having one or more slab regions.

In some embodiments, the method includes the step of: before the doping of the part of the germanium layer: disposing a photoresist over a part of an upper most surface of the partially fabricated germanium based avalanche photodiode device; and after doping the part of the germanium layer: removing the photoresist.

In some embodiments, the method further includes a step of: annealing the partially fabricated germanium based avalanche photodiode device.

In some embodiments, the method further includes a step of: disposing a cladding layer over the partially fabricated germanium based avalanche photodiode device.

BRIEF DESCRIPTION OF THE DRAWINGS

Embodiments of the invention will now be described by way of example with reference to the accompanying drawings in which:

FIG. 12A shows a top-down plan view of a variant device;

FIGS. 12B and 12C show respective cross-sections of the device shown in FIG. 12A;

DETAILED DESCRIPTION

The detailed description set forth below in connection with the appended drawings is intended as a description of exemplary embodiments of an avalanche photodiode structure provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1:
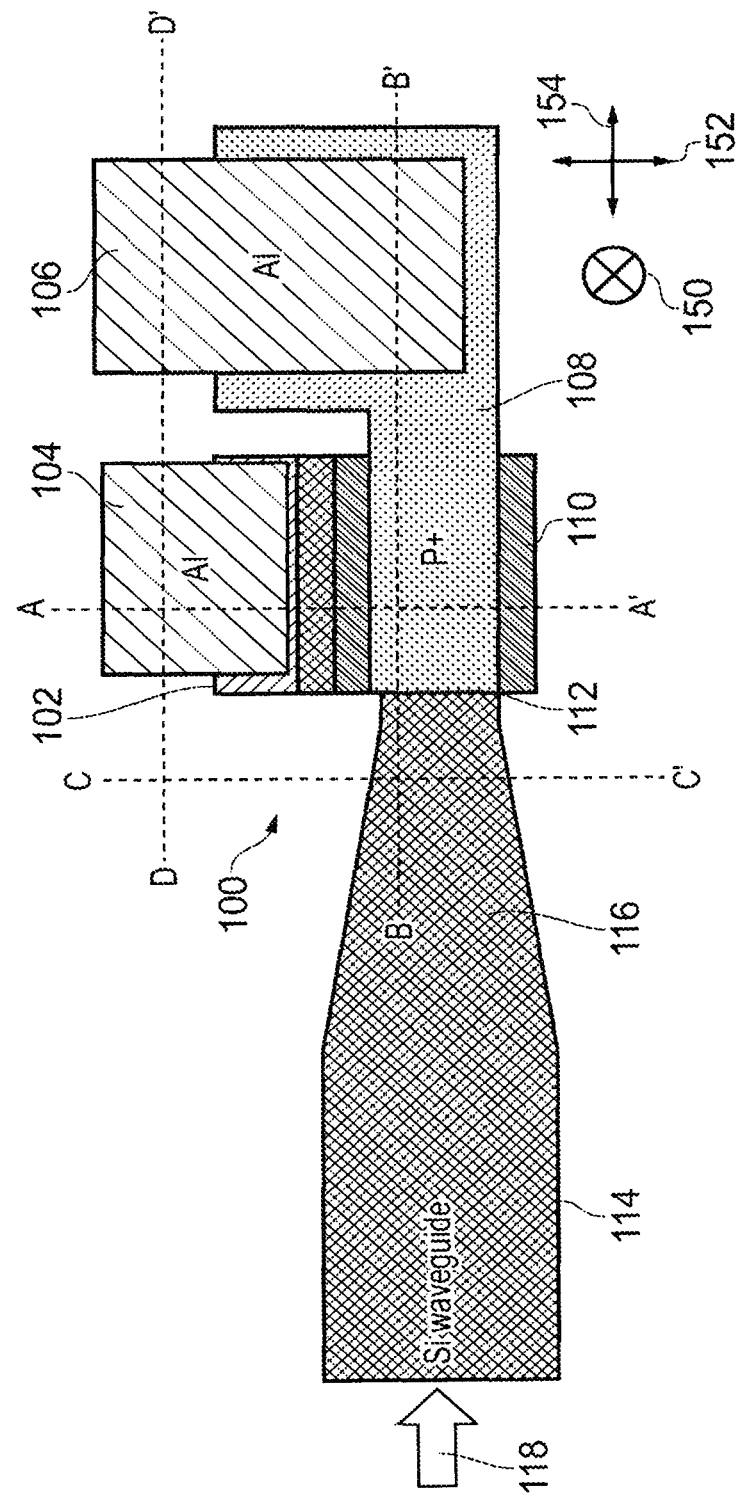
FIG. 1 shows a top-down plan view of an avalanche photodiode.

FIG. 1 shows an avalanche photodiode 100. The device broadly includes: a P+ doped region (or "upper doped germanium region") 108, an N+ doped region 210 (FIG. 2A), and a waveguide 110 disposed therebetween. Each of the doped regions is connected to respective electrodes 104 and 106 which extend in a lateral direction 152 across the device. Light may enter the device from direction 118, and pass through a silicon waveguide 114 into a tapered silicon waveguide region 116. The light continues through interface 112 into a germanium waveguide 110, whereupon it is absorbed to generate electron-hole pairs, of which the holes go to the P+ doped region 108 and the electrons go to the N+ doped region 210 when the device is reverse biased between the N+ region 210 and P+ region 108.

The device in FIG. 1 is presented in a top-down plan view. Therefore direction 150 represents moving into the device from above, whereas directions 152 and 154 are within the plane of the substrate of the device, i.e., they are parallel thereto.

In use, a reverse bias voltage can be applied to electrodes 104 and 106. This produces an electric field passing from N+ doped region 210, through the germanium waveguide 110, and into the P+ doped region 108. Thus, as light passes through interface 112, it enters germanium waveguide where it is absorbed to generate electron-hole pairs, which are separated by the electric field in the waveguide. The holes go to the P+ doped region 108 and the electrons (as well as additional electrons generated, by avalanche multiplication, in the multiplication region 206) go to the N+ doped region 210 after being accelerated by the high electrical field in the multiplication region (not shown in FIG. 1) to produce avalanche breakdown.

Figure 2A:
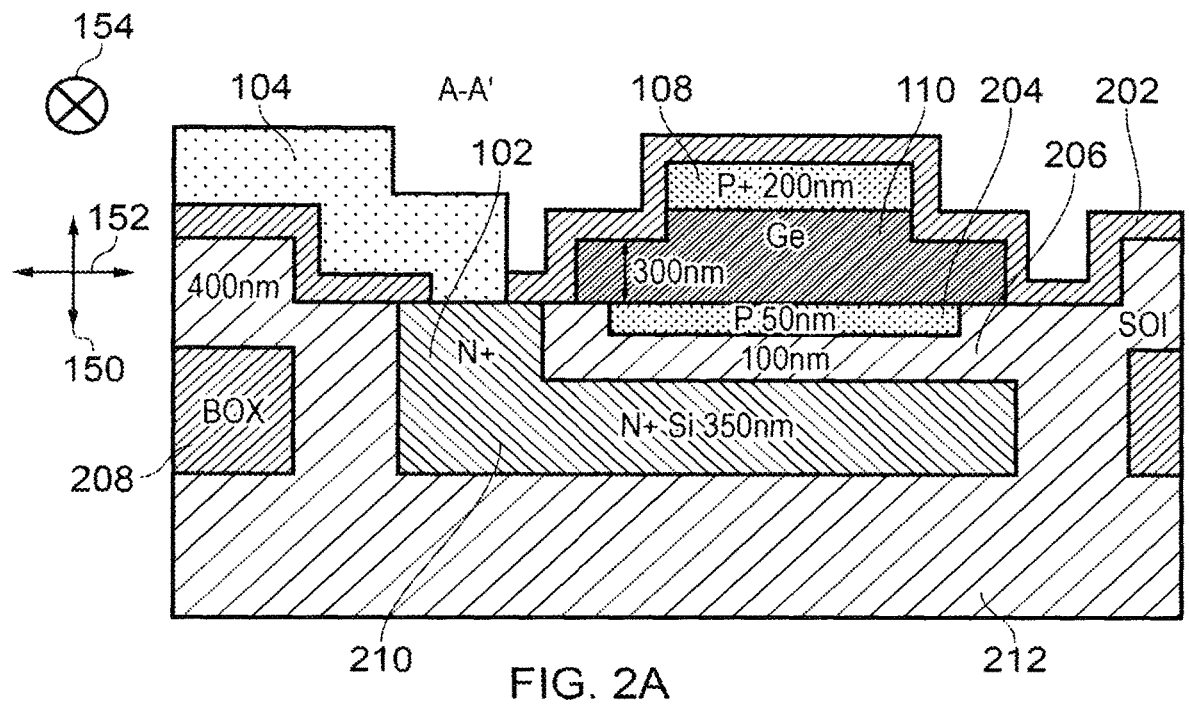
FIGS. 2A-2D show respective cross-sections of the device shown in FIG. 1.
Figure 2B:
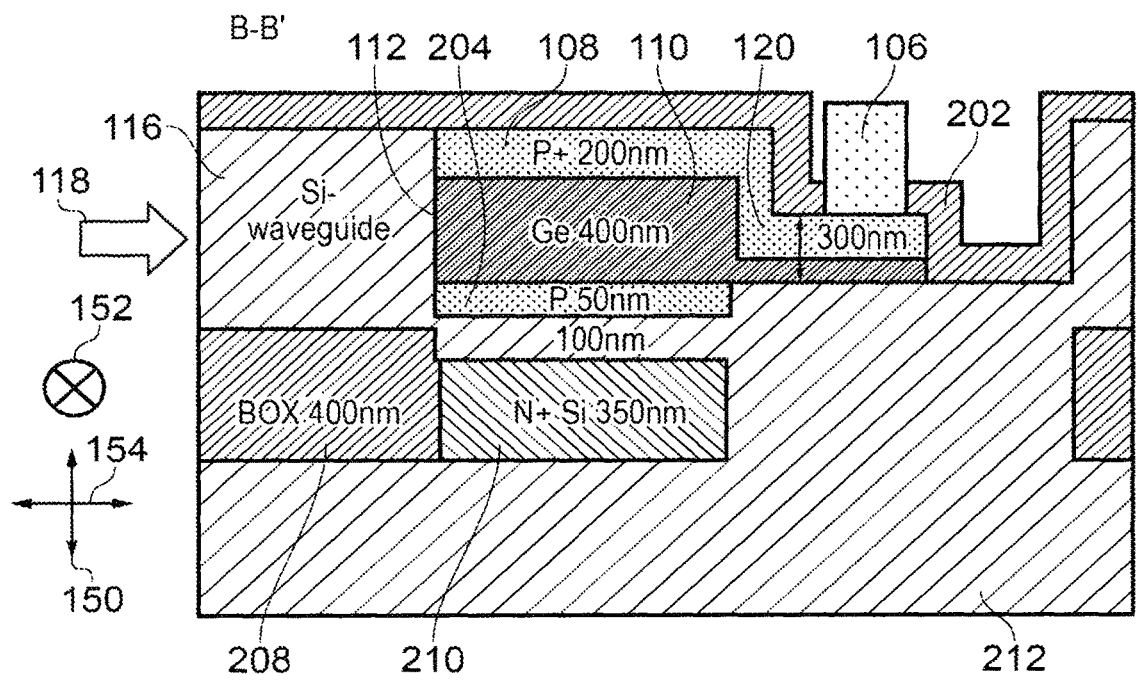

FIG. 2A shows the device 100 as taken along the cross-section A-A' indicated in FIG. 1, and FIG. 2B shows the same device as taken along the cross-section B-B' indicated in FIG. 1. As can be seen, the device comprises a substrate 212, upon which is an N+ doped region 210 and an insulator layer, e.g., a buried oxide (BOX) layer 208. The N+ doped region in this example is 350 nm in thickness. In other examples the N+ doped region is at least 200 nm in thickness (as measured from the top of the substrate to an uppermost surface of the N+ doped region). The doping concentration may be greater than $1 \times 10^{19}$ cm$^{-3}$. A part 102 of the N+ doped region 210 extends away from the substrate in direction 150, to contact electrode 104, giving the N+ doped region an shape.

Immediately above the N+ doped region 210 is an undoped (or intrinsic) multiplication region 206. In this example the multiplication region is 100 nm in thickness (as measured from the top of the N+ doped region to an uppermost surface of the multiplication region). The multiplication region may be formed of silicon, and may have a doping of no more than $1 \times 10^{16}$ cm$^{-3}$. Immediately above multiplication region 206 is an intermediate doped silicon region, which may be a P doped region 204. This P doped region may be referred to as a charge layer, as it may be used to keep the electric field across the germanium absorption region of the avalanche photodiode low, such that only the multiplication region 206 experiences large electric field (i.e. such that it might allow avalanche multiplication). The P doped region in this example is 50 nm in thickness (as measured from the top of the multiplication layer to an uppermost surface of the P doped region). In this example, the doping concentration in the P doped layer is around $2 \times 10^{18}$ cm$^{-3}$.

Immediately above the P doped region 204 is the germanium waveguide 110. The germanium waveguide in this example is a rib waveguide, having one or more slabs. The slabs in this example are approximately 300 nm in thickness, and the rib may be 300 nm in thickness (as measured from the top of the upper doped germanium region 108 to the uppermost surface of slab). As with the multiplication region, the germanium waveguide is not intentionally doped and therefore the doping concentration may be less than $1 \times 10^{16}$ cm$^{-3}$. The region of the germanium waveguide adjacent to the silicon waveguide 116 may have a height of 400 nm as measured from the top of the P doped region 204.

As is shown in FIG. 2B, the germanium waveguide is immediately adjacent to the tapered region 116 of the silicon waveguide 114. An interface 112 exists between the germanium waveguide and the tapered region 116. The tapered region 116 may have a length of about 100 microns, a width of around 1.5 µm (microns) at the narrow end (at the germanium waveguide), and a width of about 2.6 microns at the wide end.

A top portion of the rib of the germanium waveguide 110 is the upper doped germanium region 108, the top surface of which is substantially aligned with the top surface of the input silicon waveguide 116, which is connected to the second electrode 106 via a top-of-stack connector 120 which extends towards the substrate. The top-of-stack connector 120 may be integral with, (and fabricated at the same time as) the upper doped germanium region 108 as shown. The upper doped germanium region 108 in this example is 200 nm in thickness. The doping in this example is at least $1 \times 10^{19}$ cm$^{-3}$. A part of the top-of-stack connector 120 extends in a lateral direction 154 away from the germanium waveguide, to allow the second electrode 106 to electrically contact it.

The device is generally covered by a SiO2 cladding layer 202. However, via openings are fabricated in the cladding layer for the first electrode 104 and second electrode 106. This allows the electrodes to contact respective parts of the N+ doped region 102 and the top-of-stack connector 120.

Figure 2C:
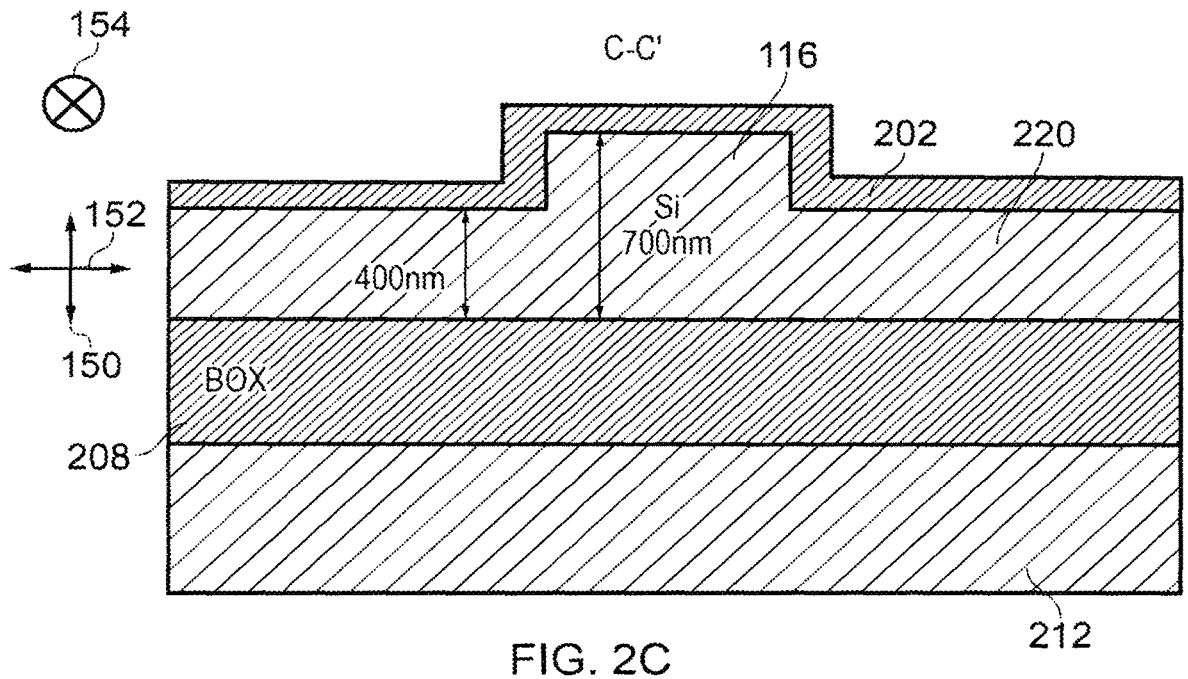
Figure 2D:
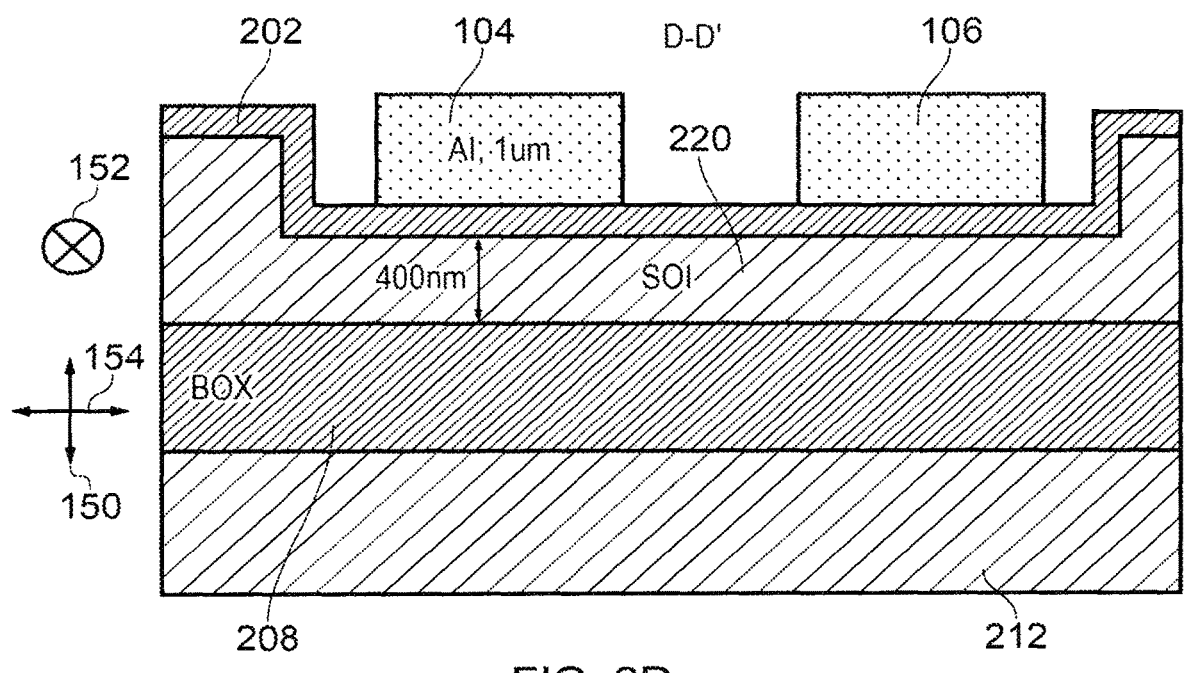

FIGS. 2C and 2D show the device 100 along respective cross-sections C-C' and D-D'. As can be seen in FIG. 2C, the silicon waveguide 116 may be a rib waveguide, where the waveguide is approximately 700 nm tall (as measured from the top of the buried oxide layer 208 to an uppermost surface of the silicon rib). A slab 220 of the waveguide may be 400 nm tall (as measured from the top of the buried oxide layer 208 to an uppermost surface of the slab). The cladding layer 202 is disposed over the top of the silicon waveguide. As can be seen in FIG. 2D, the slab 220 extends along direction 154 and is formed by etching the silicon-on-insulator layer (or "device layer") to make the silicon rib waveguide. The cladding layer 202 is disposed over this silicon-on-insulator layer, and the first and second electrodes 104 and 106 are disposed on this cladding layer.

Figure 3A:
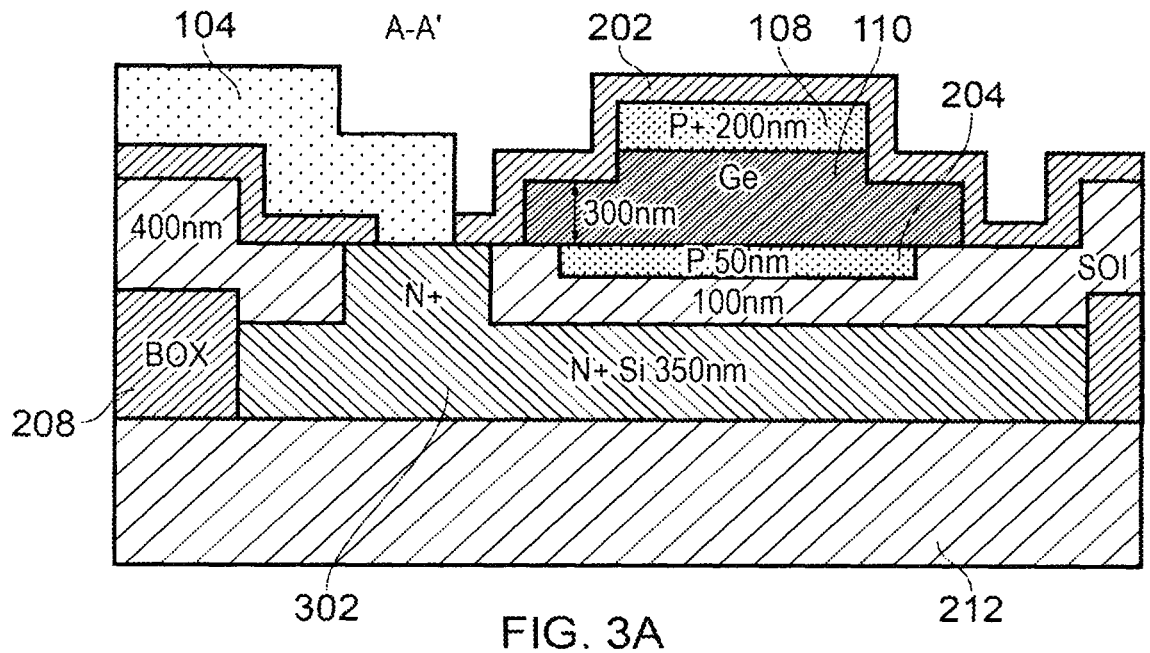
FIGS. 3A and 3B show respective cross-sections of a variant device.
Figure 3B:
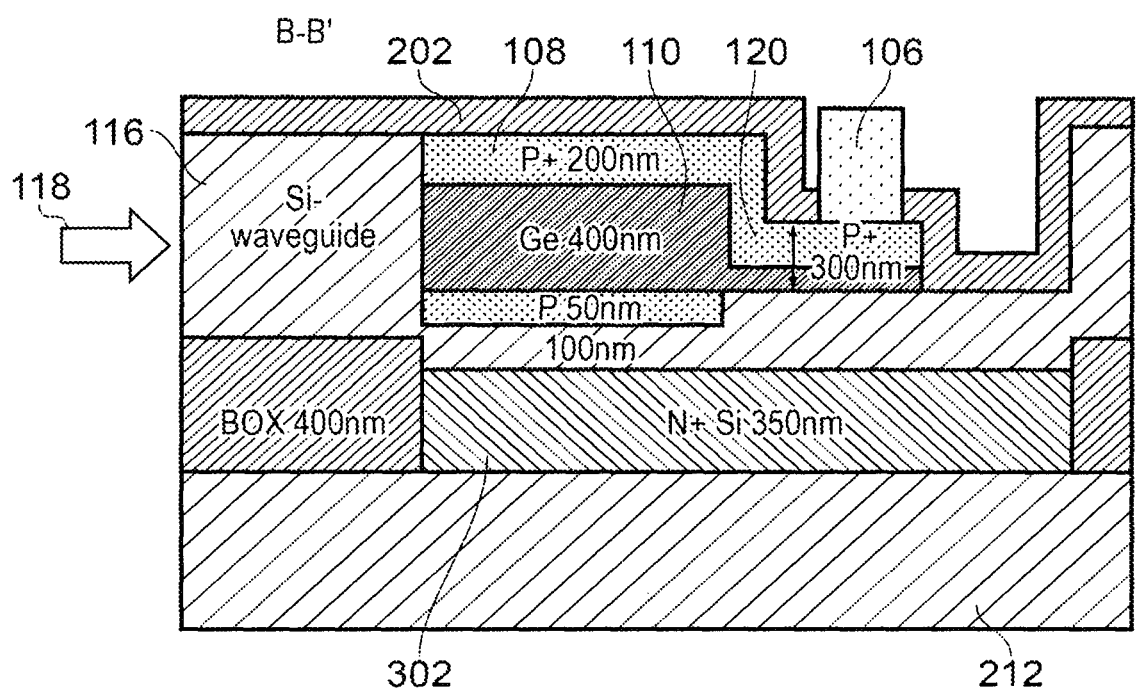

FIGS. 3A and 3B shows a variant device, where like features are indicated by like reference numerals. Where the device shown in FIGS. 3A and 3B differs from that shown in FIGS. 2A and 2B is in the lateral extension of the N+ doped region 302. In FIGS. 2A and 2B, the N+ doped region 210, which is made by ion implantation, is coterminous in lateral extension along direction 154 with one side of the germanium waveguide 110. Whereas, in FIGS. 3A and 3B, the N+ doped region 302, which is made by in situ doping during the regrowth of region 302, laterally extends further in direction 154 than the germanium waveguide 110.

Figure 4A:
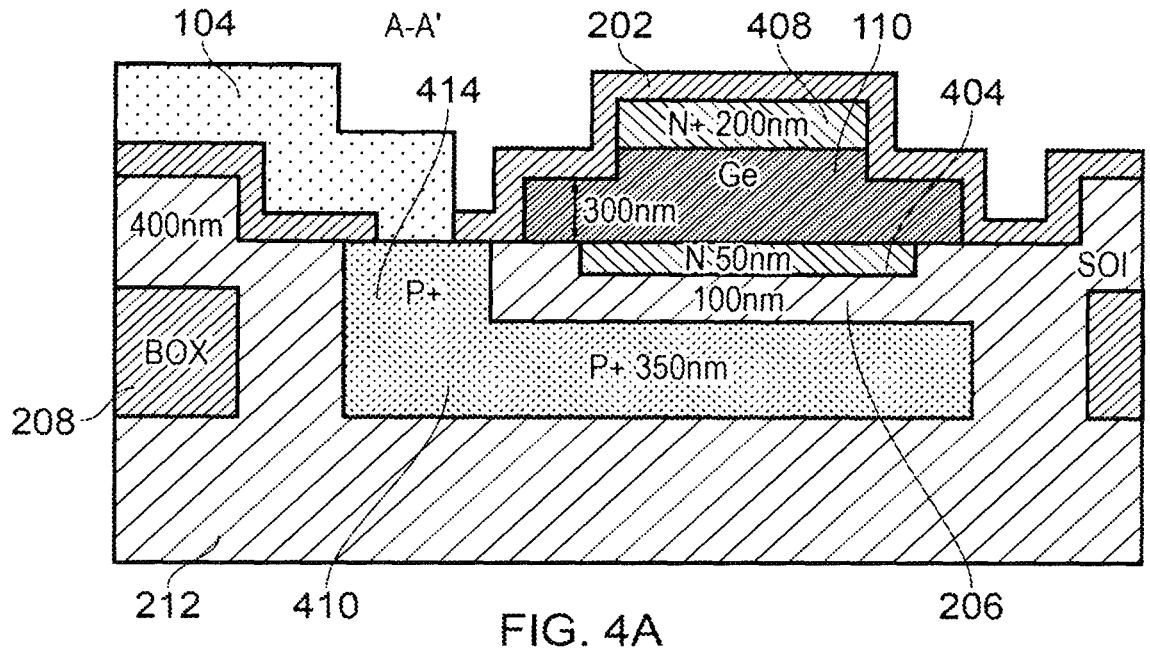
FIGS. 4A and 4B show respective cross-sections of a variant device.
Figure 4B:
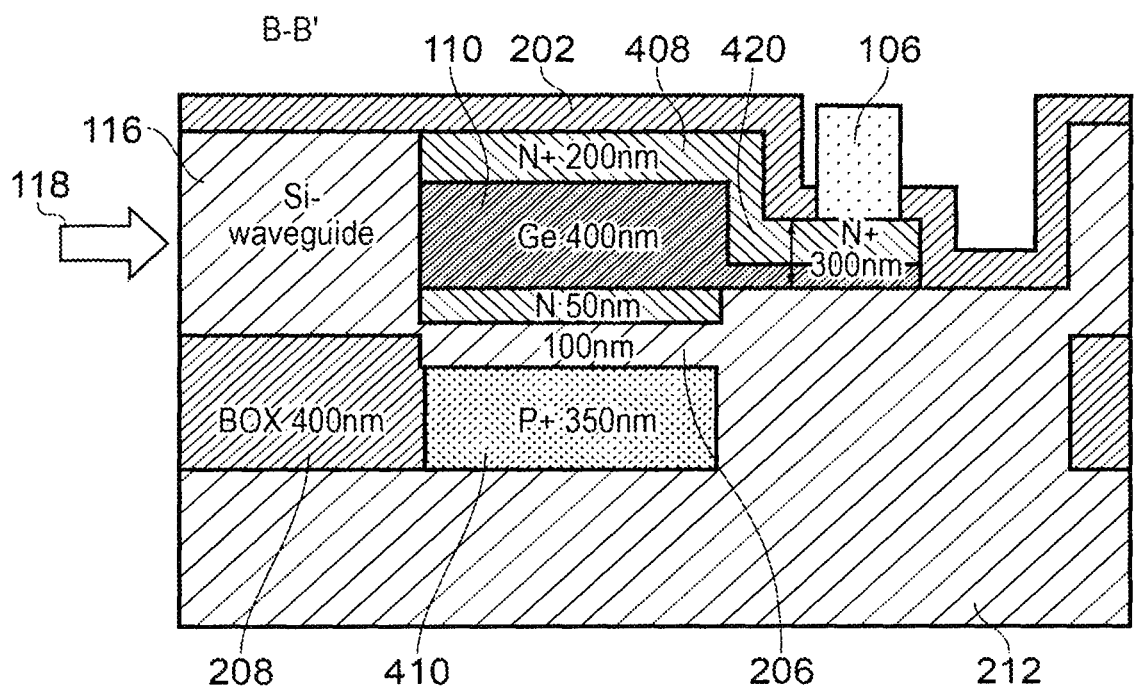
Figure 5A:
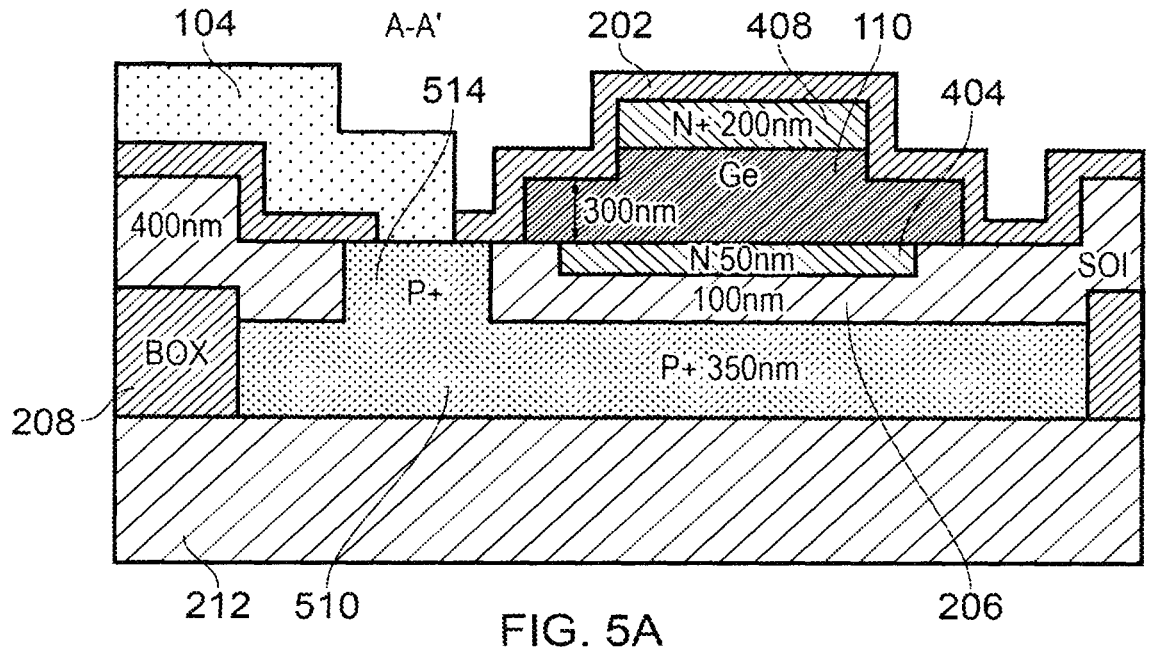
FIGS. 5A and 5B show respective cross-sections of a variant device.
Figure 5B:
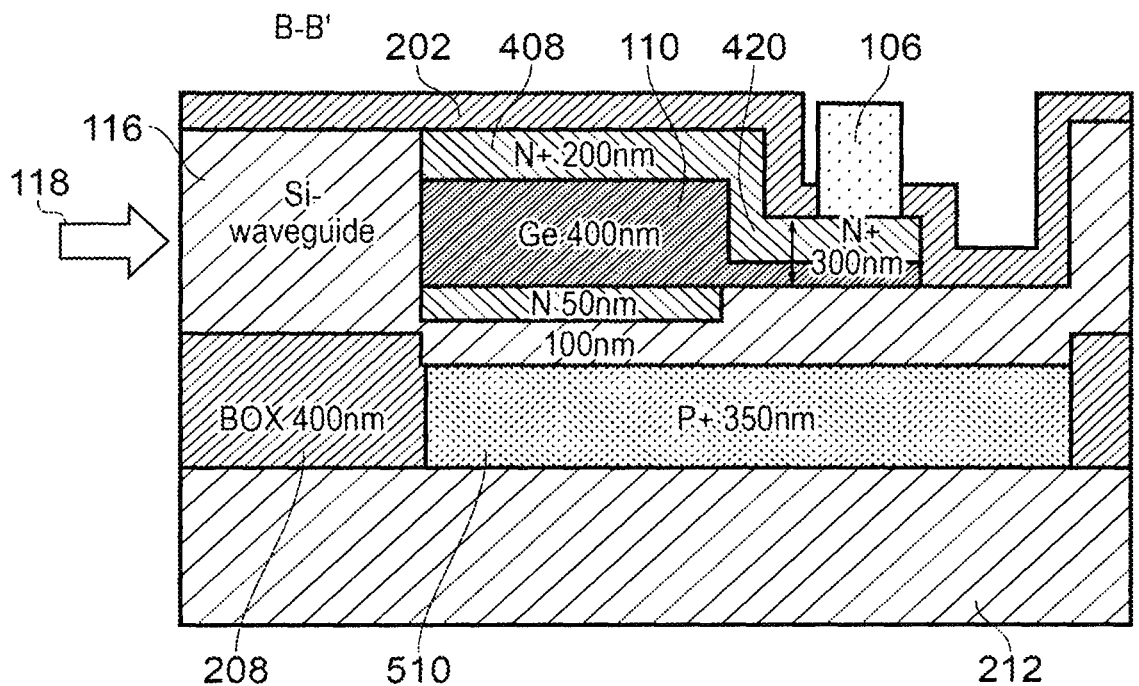

FIGS. 4A and 4B show a further variant device, where like features are indicated by like reference numerals. In contrast to the device in FIGS. 2A and 2B, the uppermost doped region 408 and the top-of-stack connector 420 are N+ doped regions, the lowermost doped region 410 is a P+ doped region, and the intermediate doped region 404 is an N doped region. Similarly, FIGS. 5A and 5B show a further variant device, where the doped regions in FIGS. 3A and 3B have been switched. Therefore, the laterally extending doped region 510 is P+ doped, the intermediate doped region 404 is N doped, and the uppermost doped region 408 and the top-of-stack connector 420 are N+ doped regions.

Figure 6A:
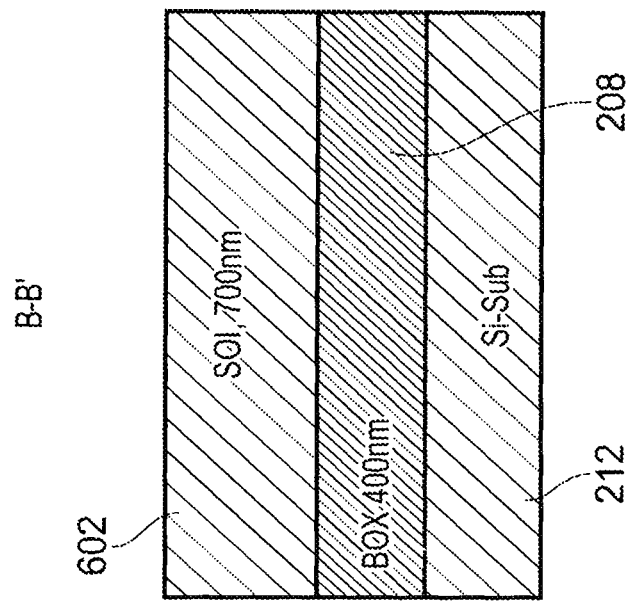
FIGS. 6A(i)-6T(ii) show various stages in the manufacture of the device shown in FIG. 1.
Figure 6A:
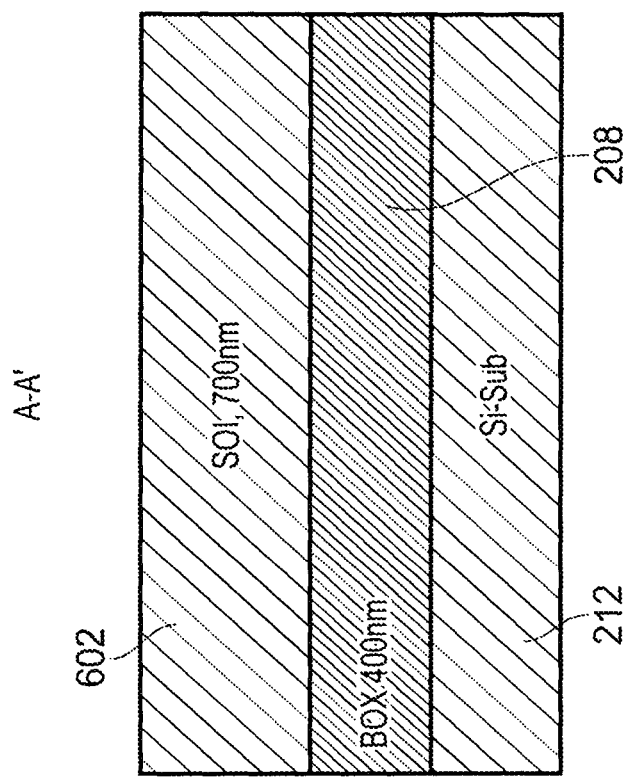
Figures 7, 7I:
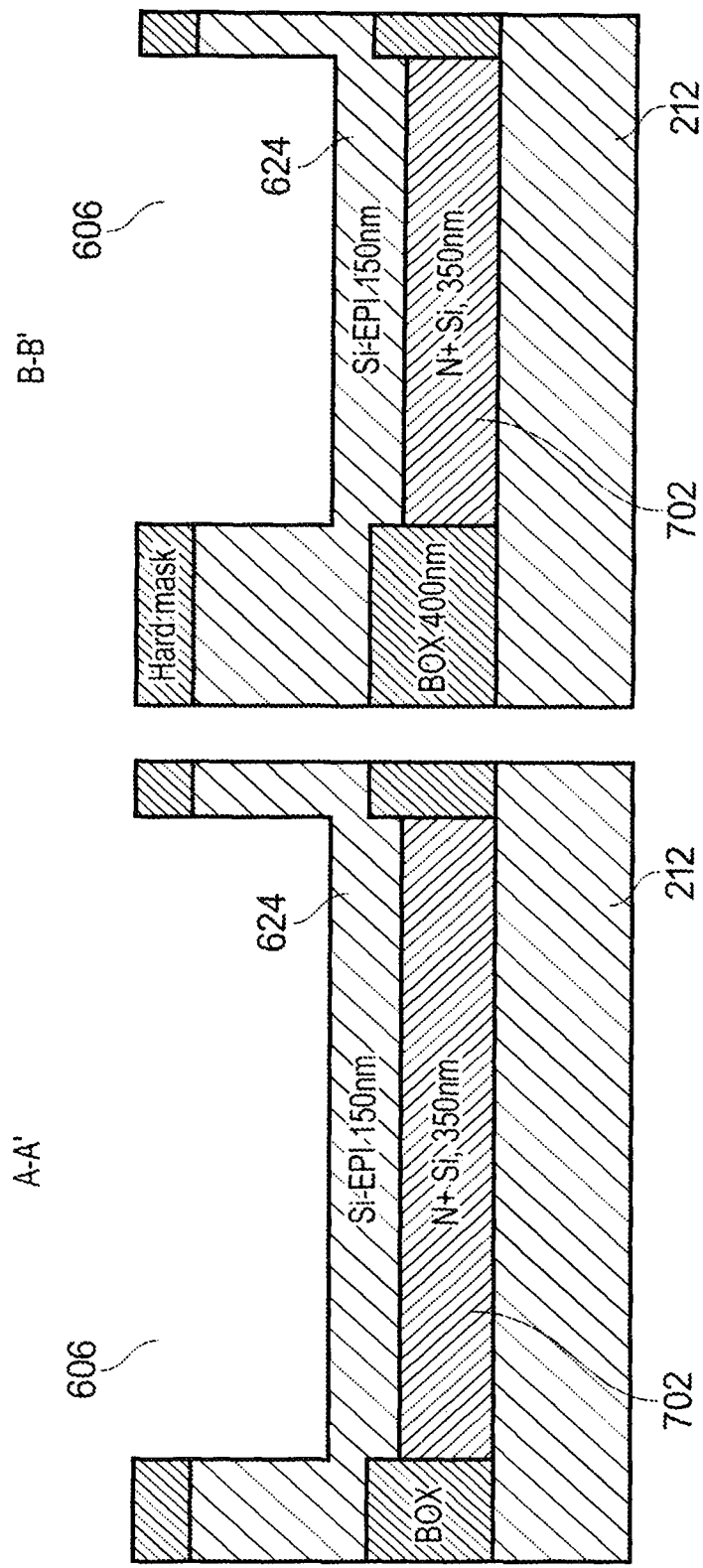
FIGS. 7(i) and 7(ii) show a variant manufacturing step.

A method of manufacturing the above devices is now discussed in relation to FIGS. 6A(i)-6T(ii) (and a variant in one of the steps of manufacture is shown in FIGS. 7(i) and 7(ii)). In each set of figures, the (i) figure shows the manufacturing step along the A-A' cross section and the (ii) figure shows the same manufacturing step along the B-B' cross section.

Therefore, starting from FIGS. 6A(i) and 6A(ii), a substrate 212 is provided (which may be silicon) above which is a buried oxide layer 208. The buried oxide layer may be 400 nm in thickness. Above the buried oxide layer is a silicon-on-insulator layer (or "device layer") 602 which may be 700 nm in thickness.

An etching step is then performed as shown in FIGS. 6B(i) and 6B(ii), to produce a cavity 606 which extends beyond the buried oxide layer 208 to the substrate 212. Before the etching step is performed, a hard mask 604 is disposed over the region of the silicon-on-insulating layer 602 which is not to be etched.

Figure 6D:
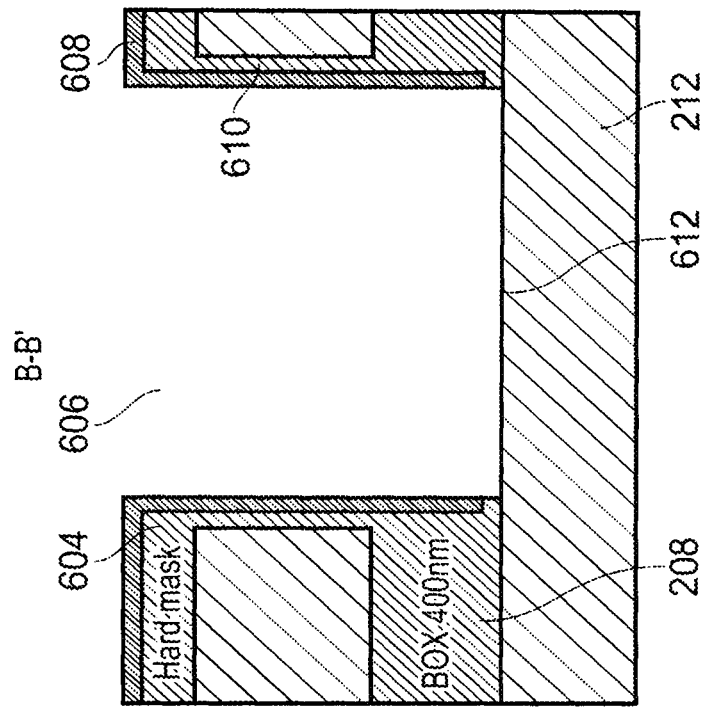
Figure 6D:
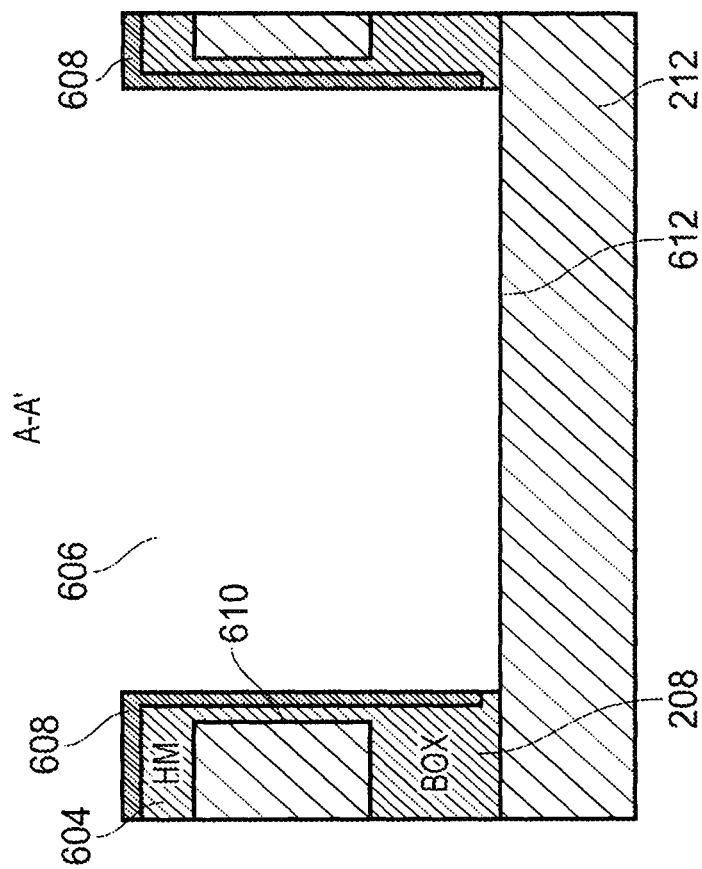

After etching, a liner may be disposed within the cavity 606, to thereby line the cavity sidewalls 610 and cavity bed. The liner may be provided as a 20 nm thick SiO$_2$ layer. Subsequent to the liner being disposed, a further cover layer 608 is disposed on top of the liner as shown in FIGS. 6C(i)

and 6C(ii). The cover layer may be a 20 nm thick $Si_3N_4$ layer. This allows the liner and cover layer disposed immediately atop the cavity bed 612 to be etched, leaving a liner 610 and cover layer 608 along the sidewalls of the cavity 606 as shown in FIGS. 6D(i) and 6D(ii). After the cavity bed 612 is exposed, the cover layer 608 can be removed resulting in a device as shown in FIGS. 6E(i) and 6E(ii), where the cavity 606 has an exposed bed 612, but lined sidewalls 610.

The thickness of the liner is precisely designed so that most of the liner will be removed in a pre-epi cleaning process (which precedes the epitaxial growth process described below) with several nm left, which has no impact on the device performance, so there is no need for a dedicated process step to remove the sidewall liner. A silicon layer 614 is then epitaxially grown from the bed of the cavity 606 from the substrate 212, as shown in FIGS. 6F(i) and 6F(ii). In this example, the silicon layer is 350 nm tall, and does not extend as high as the uppermost surface of the buried oxide layer 208.

As shown in FIGS. 6G(i) and 6G(ii), a photoresist 618 is then disposed over (i) the top layer of the hard mask 604; (ii) the sidewalls of cavity 606; and (iii) a portion 618 of the bed of the cavity 606. After the photoresist is disposed, dopants 616 of a first species are implanted into an uncovered region 614 of the bed of the cavity 606. The implantation may be at around 90° relative to the substrate. The result of this doping is shown in FIG. 6H(i) and 6H(ii) after the first photoresist has been removed. A doped region 620 extends across a part of the bed of the cavity 606. As shown in FIG. 6H(i), there are undoped regions either side of the doped region, between it and the buried oxide layer 208. Similarly, as shown in FIG. 6H(ii) there is an undoped region 622 behind the doped region 620 relative to the guiding direction of the light, i.e., on an opposite side of the doped region 620 to the silicon waveguide 112. In this example, the dopants are of an N-type species (e.g. phosphorus), and doping is performed to result in a high dopant concentration. An annealing process is performed at this stage to activate the dopant in the epitaxially grown silicon layer 622. Typical annealing conditions are 1050-1100° C. for 5-10 seconds with rapid thermal annealing (RTA), and 1050-1100° C. for 10-30 minutes with furnace annealing. The doped region 620 is an N+ doped region, with a thickness of around 350 nm.

In a subsequent step, shown in FIGS. 6I(i) and 6I(ii), a further epitaxially grown silicon layer 624 is grown from the N+ doped region 620 within cavity 606. The further silicon layer in this example has a thickness of around 150 nm. After the growth, a second photoresist 628 is disposed over a part of the further silicon layer 624, but leaving an implantation window 629 over a region of the further silicon layer, as shown in FIGS. 6J(i) and 6J(ii). After the second photoresist has been disposed, further dopants 626 of the same species used in the step shown in FIG. 6G(i) and 6G(ii) are implanted into the uncovered region of the further silicon layer 624. The implantation may be an un-angled implantation, i.e., it may be performed at around 90° relative to the substrate.

Figure 6K:
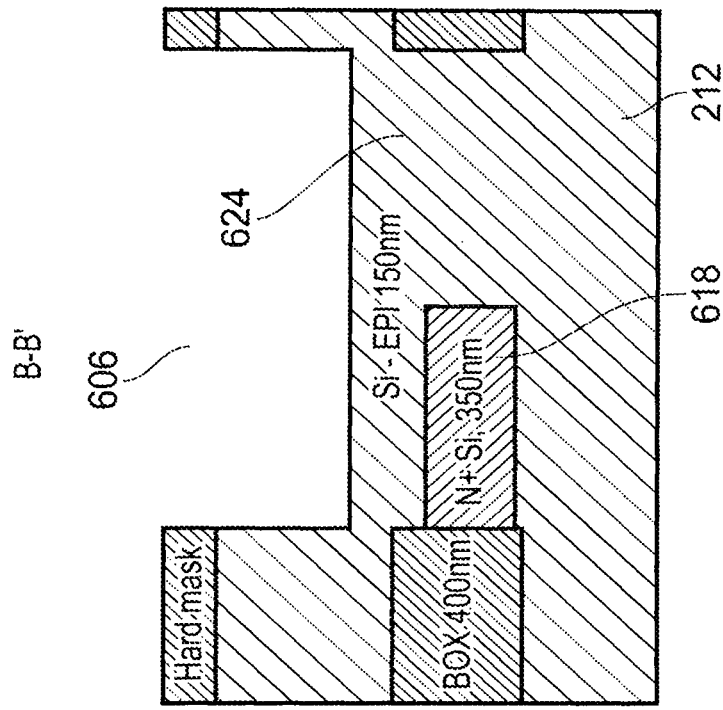
Figure 6K:
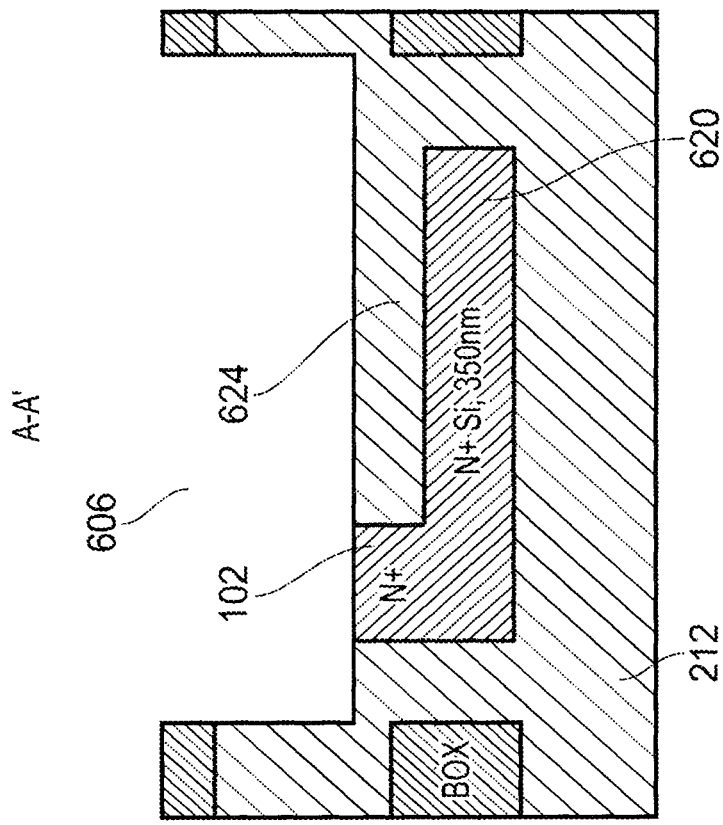

The result of this further doping is shown in FIGS. 6K(i) and 6K(ii), where a part 102 of the N+ doped region extends away from the substrate 212 through a part of the further silicon layer 624. The N+ doped region therefore has an 'L' shape.

Next, a third photoresist 631 is disposed over the device, leaving an implantation window 637 above a region of the further silicon layer 624, as shown in FIGS. 6L(i) and 6L(ii). Dopants 633 of a second species are then implanted into the region of the further silicon layer which is exposed by implantation window 637. The dopants in this example are boron ions, and so P doping occurs to the exposed region of the further silicon layer. The implantation may be an un-angled implantation, i.e., it may be performed at around 90° relative to the substrate.

After doping is completed, the device may be annealed at 1050-1100° C. for 5-10 seconds to activate the dopants as shown in FIGS. 6M(i) and 6M(ii). The P doped region 634 in this example is around 50 nm in thickness, and the region between the P doped region and the N+ doped region 620 is the multiplication region 632. The multiplication region is around 100 nm high (i.e., it spans a distance of 100 nm between the bottom of the P doped region 634 and the top of the N+ doped region 620). As discussed above, the multiplication region is not intentionally doped (and therefore it will generally have a dopant concentration of less than $1 \times 10^{16}$ cm$^{-3}$).

In a further step, germanium 636 is epitaxially grown into the cavity 606 as shown in FIGS. 6N(i) and 6N(ii). Initially the growth of germanium results in a rough and uneven uppermost surface as indicated in the figures, and may extend out of the cavity. The germanium substantially fills the cavity 606. The rough and uneven surface is then smoothed by, for example, chemical-machine planarization (or "chemical-mechanical polishing") (CMP). The result of this planarization is shown in FIGS. 6O(i) and 6O(ii). The uppermost surface of the germanium is substantially level with the hard mask 604.

A mask layer 656 is then disposed over the germanium, as well as the regions of the silicon-on-insulator layer which are not within the cavity 606. A photoresist 640 is then disposed over the mask layer to pattern the waveguides in both the germanium and the SOI, therefore, the germanium waveguide and the silicon waveguide are self-aligned and may be formed by a single step of etching process. The result after the etching is shown in FIGS. 6P(i) and 6P(ii). The germanium now provides a rib waveguide, comprising a rib 648, first and second lateral slabs 642 and 644, as well as a rear-most slab 650 towards the back of the device (i.e. on an opposite side of the device to the silicon waveguide).

Further etching then takes place after a photolithographic process to define the waveguide which is covered by photoresist PR, to make the rib 648 and the lateral extension of slabs 642, 644 and 650. The etching also exposes N+ doped region 102 for connection to the electrode. The result of this further etching is shown in FIGS. 6Q(i) and 6Q(ii). In some examples, after the further etching stage the germanium waveguide has a width of around 1.5 µm. The further etching should be sufficient so as to expose the N+ doped region 102.

Next, a thin layer of SiO2 202 is disposed over the device, having a thickness of between 20-50 nm, and a photoresist 658 then disposed over a portion of the device to define the P+ region as shown in FIGS. 6R(i) and 6R(ii), over the rib 648 of the germanium waveguide. Dopants 660 of a second species are then implanted into the rib 648 of the germanium waveguide and the rear-most slab 650. As shown in FIG. 6R(ii), these dopants may be implanted at an angle of 45° relative to the uppermost surface of the rib 648. In this example, the dopants are boron, and therefore a P-type species dopant.

The photoresist is then removed, and a thick layer of SiO2 (about 500 nm) is deposited followed by an annealing process with a temperature 600-630° C. for 5 to 10 seconds to activate the dopant boron. Notably, the dopants will also produce a doped region 662 in the rear-most slab 650. This is shown in FIGS. 6S(i) and 6S(ii). The concentration of the P-type dopants is generally greater than $1 \times 10^{19}$ cm$^{-3}$, and therefore the doped regions 108 and 662 are P+ type doped in comparison to region 634. The doped regions 108 and 662 are generally 200 nm in thickness.

After opening vias, a final metallization step is performed, illustrated in FIGS. 6T(i) and 6T(ii), first electrode 104 is disposed so as to contact N+ doped region 102, and second electrode 106 is disposed so as to contact P+ doped region 662.

FIGS. 7(i) and 7(ii) show a variant step which would replace the step shown in FIGS. 6G(i) and 6G(ii). Here, as opposed to doping the bed 614 of the cavity 606 with ion implantation process, instead the entire bed of the cavity is doped with in situ N+ species dopants during the EPI process to form N+ doped region 702 with a thickness of 350 nm. Then a silicon layer 624 can be grown from the N+ doped region 702 within cavity 606. After this variant step, the steps shown in FIGS. 6H(i)-6T(ii) are performed as described as above. An advantage to this variant step is to remove one ion implantation process and one annealing process as compared with the previously described method, which can reduce the complexity of manufacture. The variant step shown in FIGS. 7(i) and 7(ii) results in a device as shown in FIGS. 3A and 3B (when the lower doped region is a N+ doped region) or a device as shown in FIGS. 5A and 5B (when the dopants are a P-type species dopant).

Figure 8:
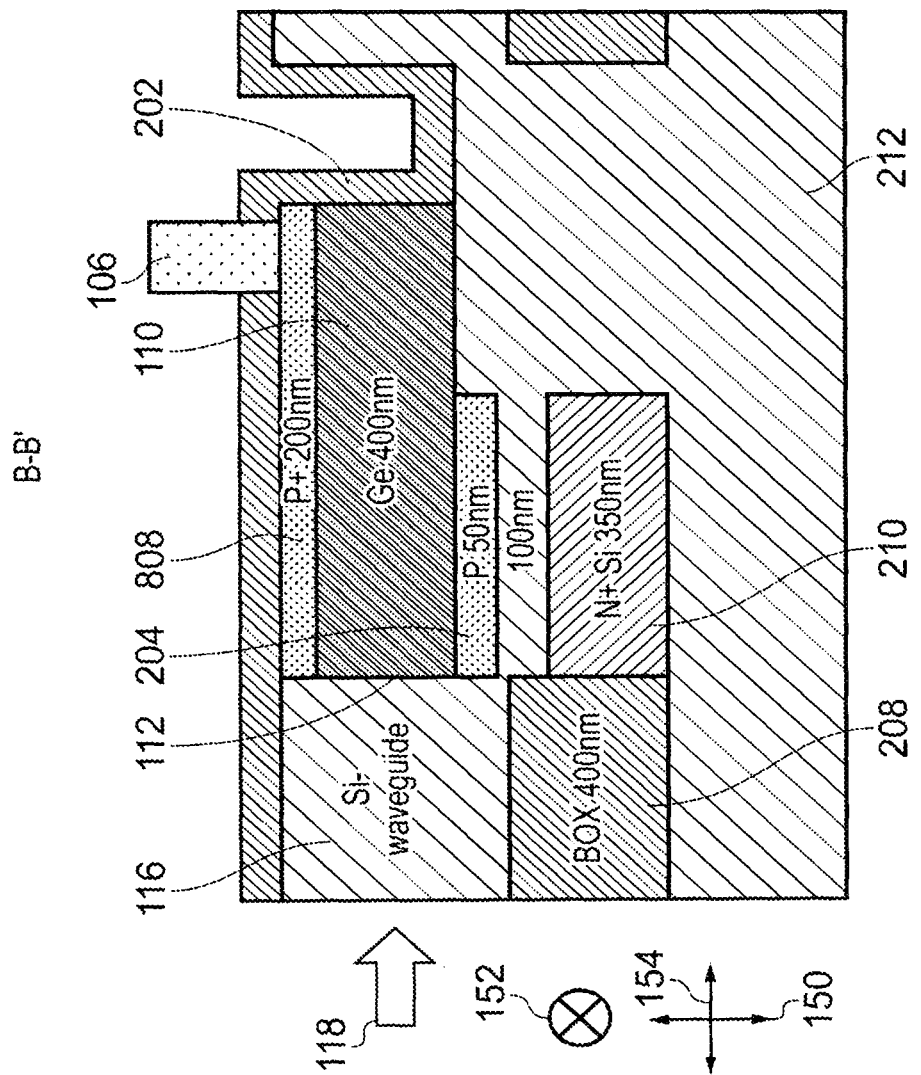
FIG. 8 shows a variant structure for the second electrode.

FIG. 8 shows a variant structure for the second electrode as taken along the cross-section B-B' indicated in FIG. 1. Unlike that in FIG. 2B, the P+ region 808 of FIG. 8 is not etched down to the slab thickness of 300 nm, i.e., the P+ doped region has a generally constant height relative to the substrate.

Figure 9A:
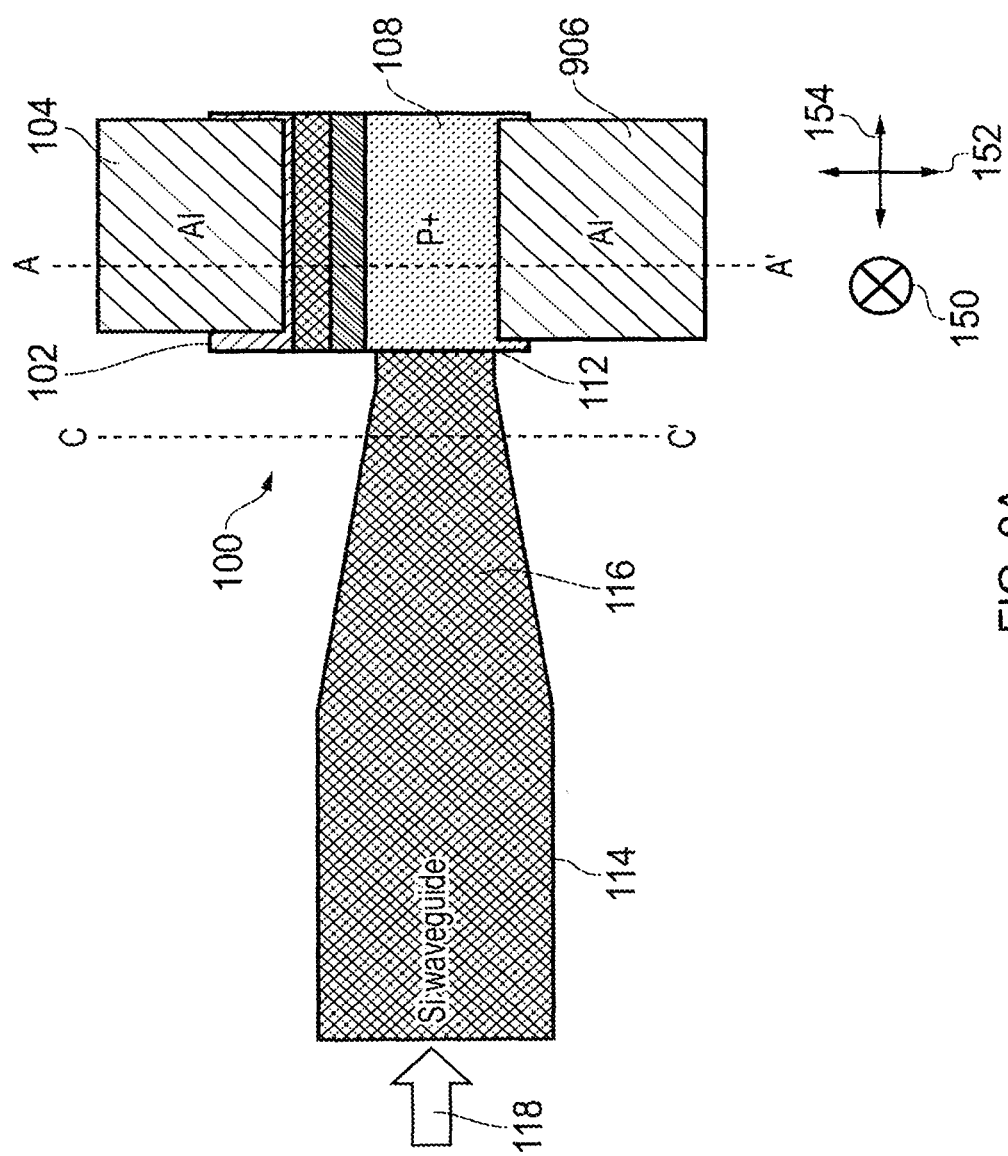
FIG. 9A and 9B show the structure top view and cross-section of a variant device.
Figure 9B:
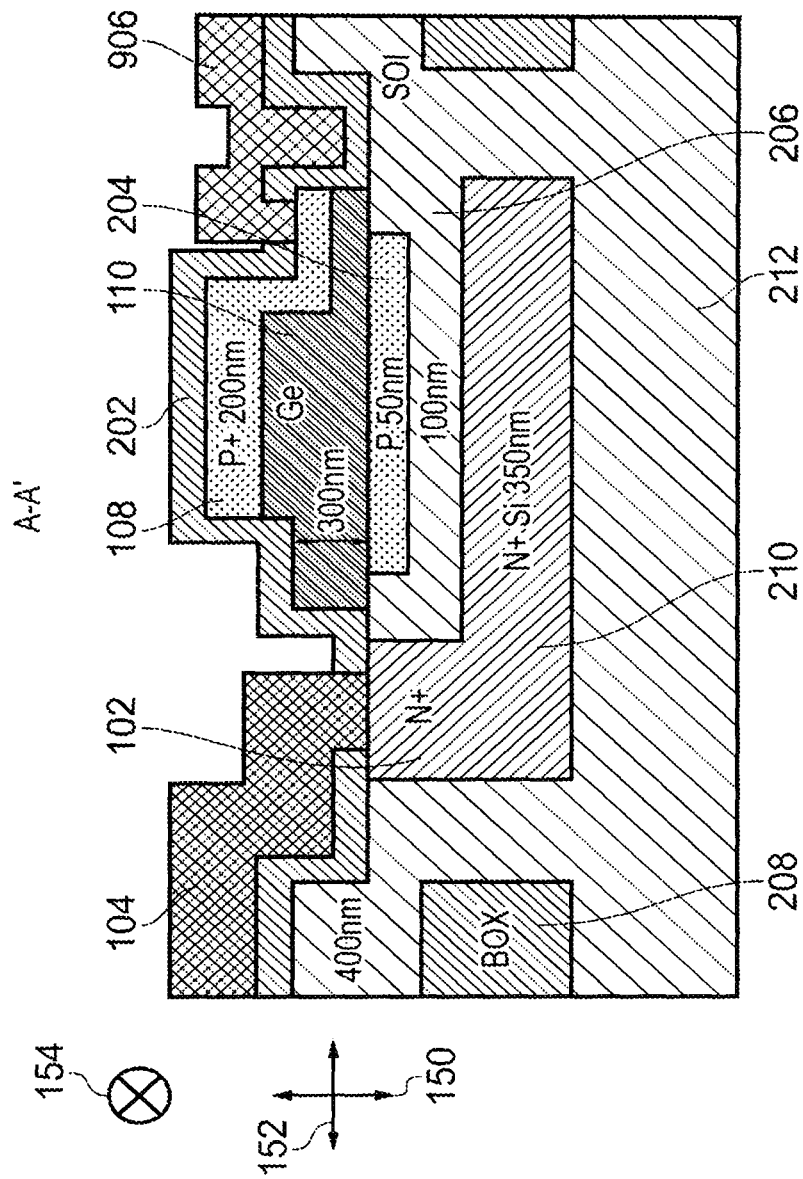

FIG. 9A and 9B show a variant device top view and cross-section view along A-A'. In FIG. 9A, the second slab in the opposite direction of the first electrode 104 is P+ doped, and the second electrode 906 contacts the second slab. FIG. 9B shows the same device as taken along the cross-section A-A' indicated in FIG. 9A. The second slab is P+ doped and the second electrode 906 is contacted with the second slab and extends laterally in the opposite direction of the first electrode 104.

Figure 10A:
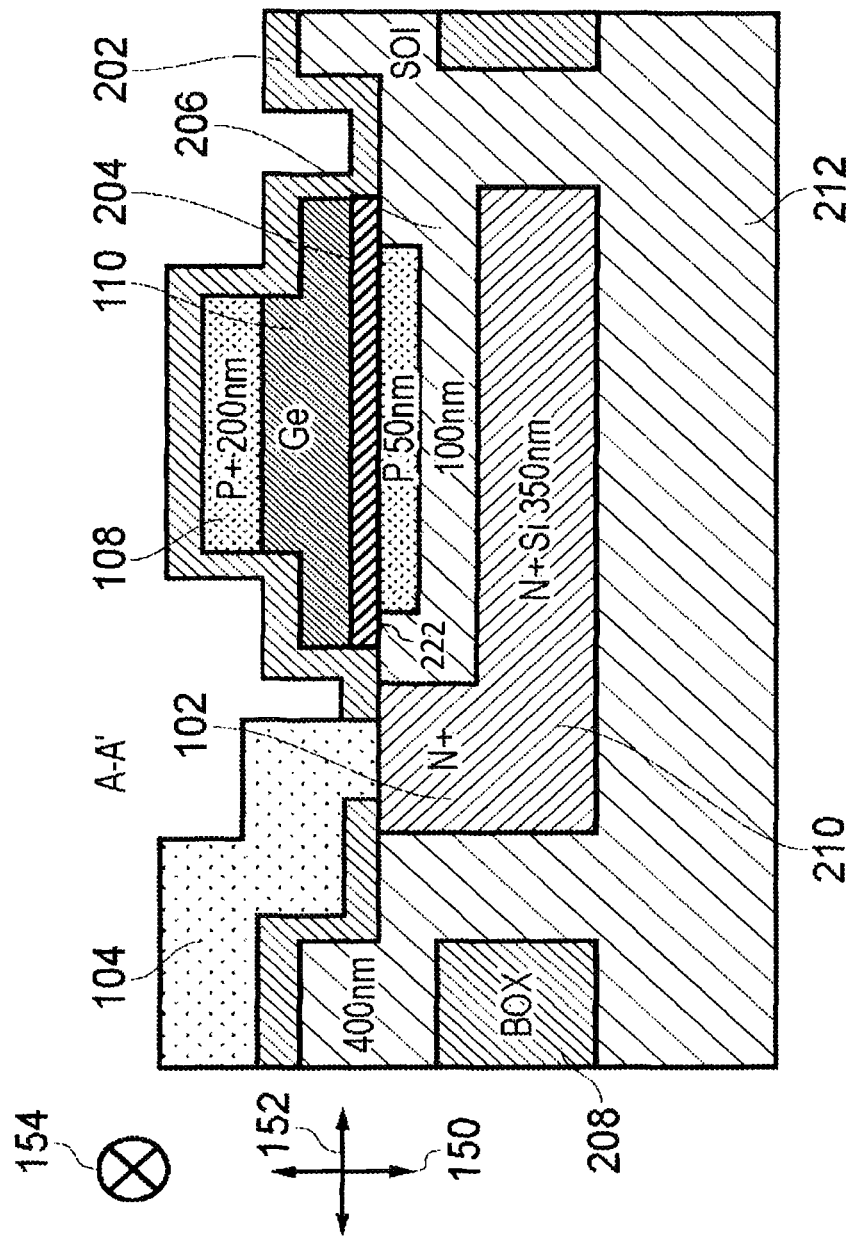
FIGS. 10A and 10B show respective cross-sections of a variant device.
Figure 10B:
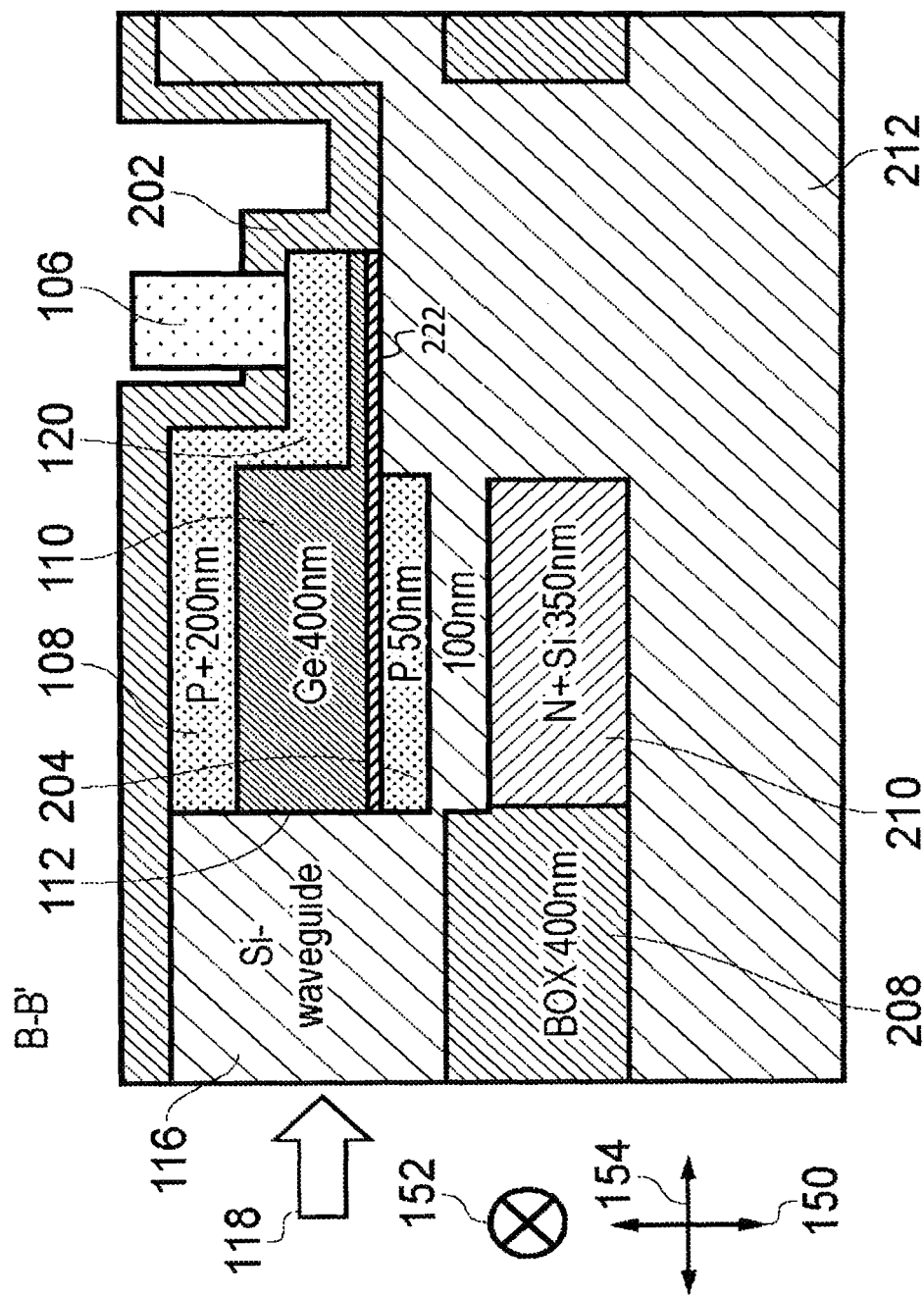

In some embodiments, a layer (e.g., a 50 nm-100 nm thick layer) of the germanium waveguide 110 that is adjacent to the intermediate doped region 204 is doped with the same doping polarity as the doping polarity (e.g., P type) of the intermediate doped silicon region 204. FIGS. 10A and 10B show a structure that may result when the embodiment of FIG. 2A is modified in this manner. The presence of the additional doped layer or "doped germanium interface layer" (or "doped germanium interface region", or "germanium charge layer") 222 may affect several characteristics of the avalanche photodiode. Because the doped germanium interface region 222 is doped the same polarity as the silicon charge layer, there are two effects on the characteristics of the device. First, the defects in the defect-rich germanium interface layer are (if the germanium interface layer is doped) no longer in an intrinsic region, so they produce no carrier generation-recombination (G-R) contribution to the device's leakage current, and, as a result, the leakage current of the avalanche photodiode may be reduced. Further, during operation, when a reverse bias is applied to the avalanche photodiode, there is almost no electric field in the doped germanium interface region 222, since it has the same doping polarity as the silicon layer 20. As a result, the multiplication of defects, which otherwise might occur in the defect-rich germanium interface layer as a result of impacting of the existing defects by photogenerated carriers, may be reduced or eliminated, improving the device's long-term reliability. The embodiments of FIGS. 3A-5B may be modified in an analogous manner, to similar effect.

Figure 11A:
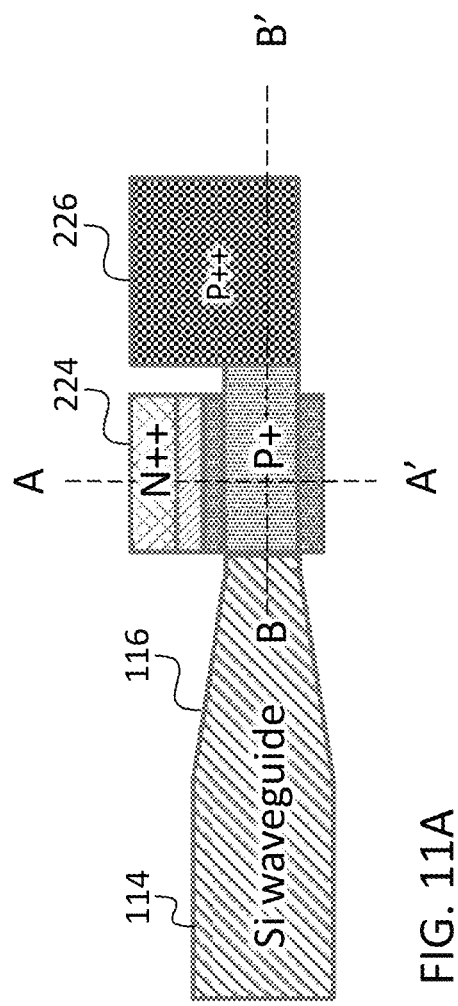
FIG. 11A shows a top-down plan view of a variant device.
Figure 11C:
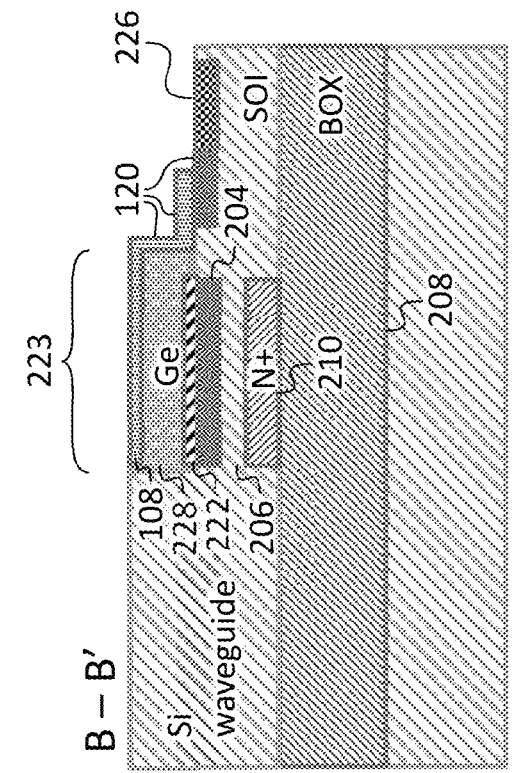
FIGS. 11B and 11C show respective cross-sections of the device shown in FIG. 11A.
Figure 11B:
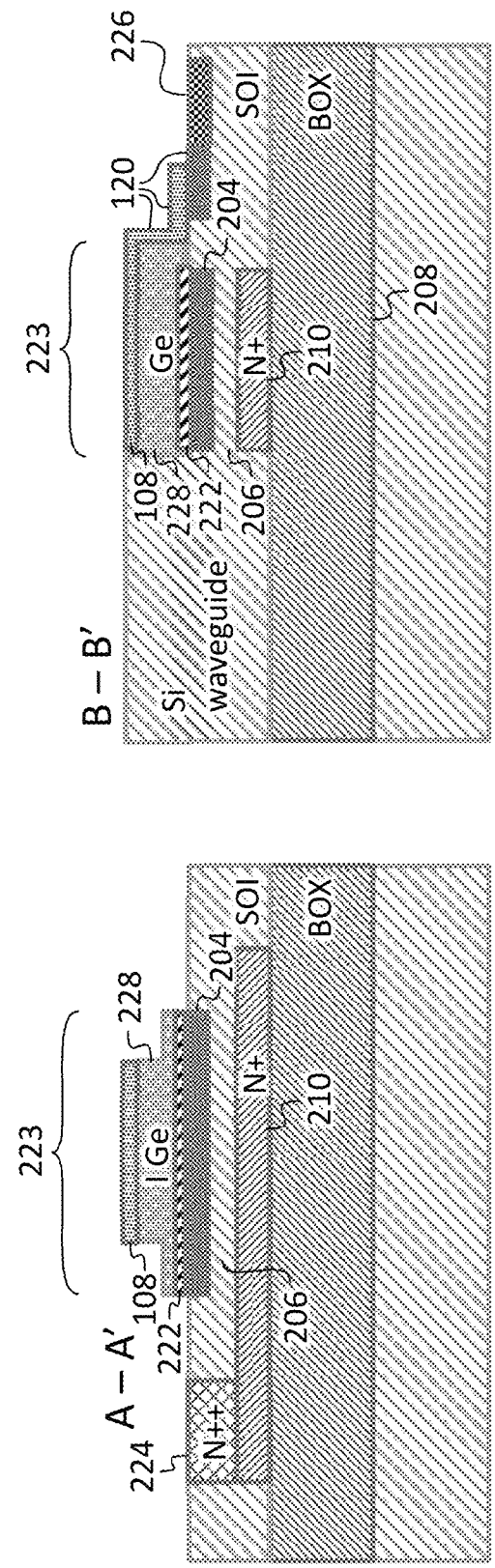
Figure 13A:
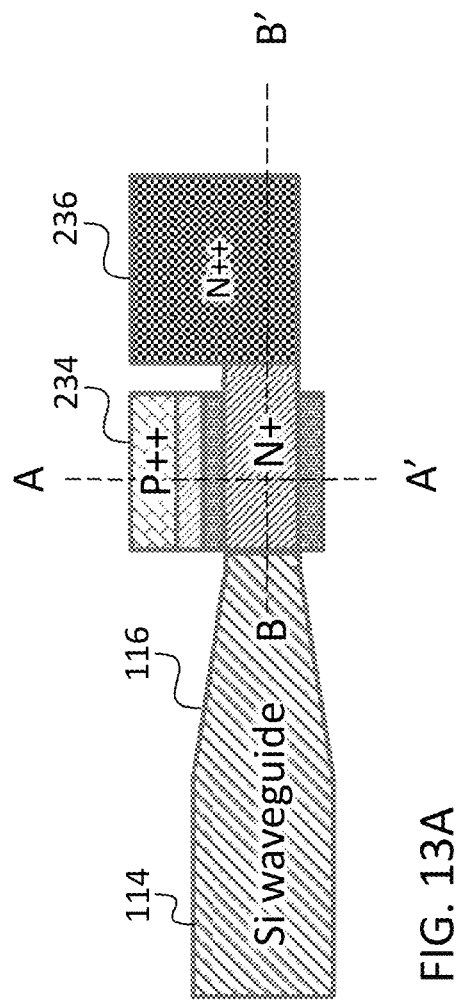
FIG. 13A shows a top-down plan view of a variant device.
Figure 13C:
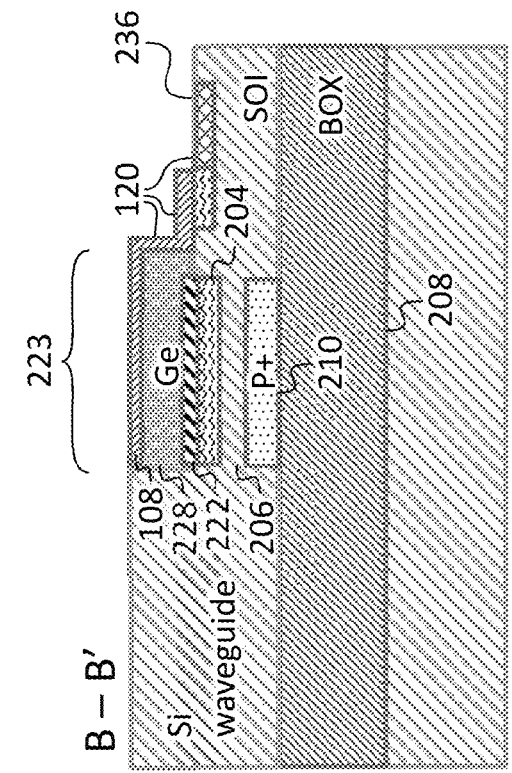
FIGS. 13B and 13C show respective cross-sections of the device shown in FIG. 13A.
Figure 13B:
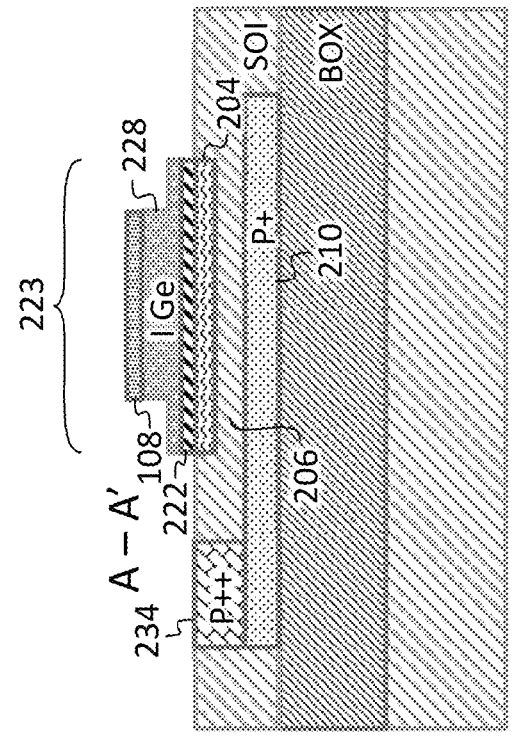
Figure 14A:
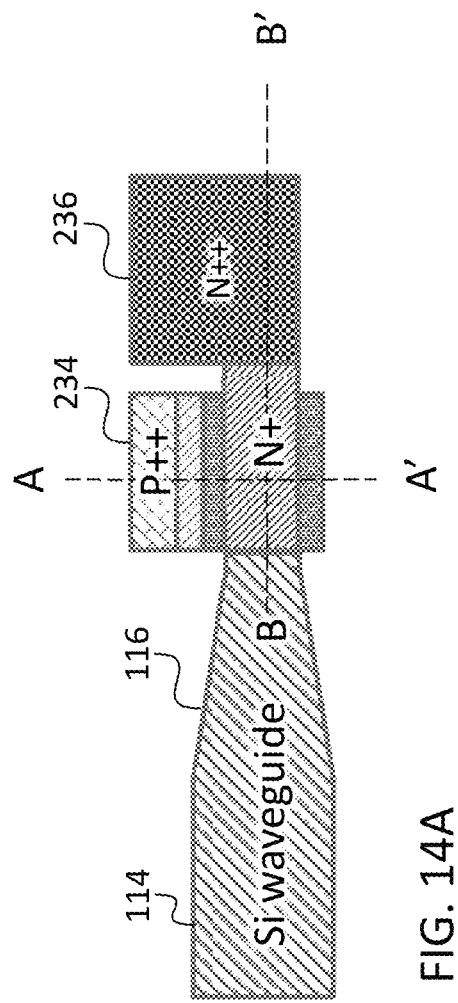
FIG. 14A shows a top-down plan view of a variant device.
Figure 14C:
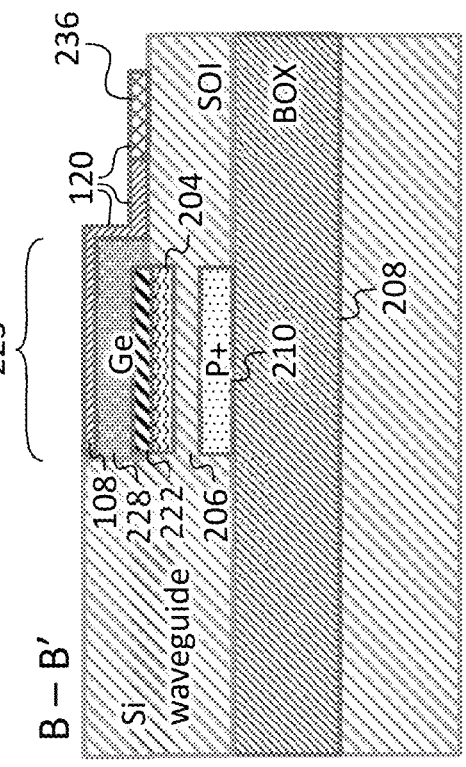
FIGS. 14B and 14C show respective cross-sections of the device shown in FIG. 14A.
Figure 14B:
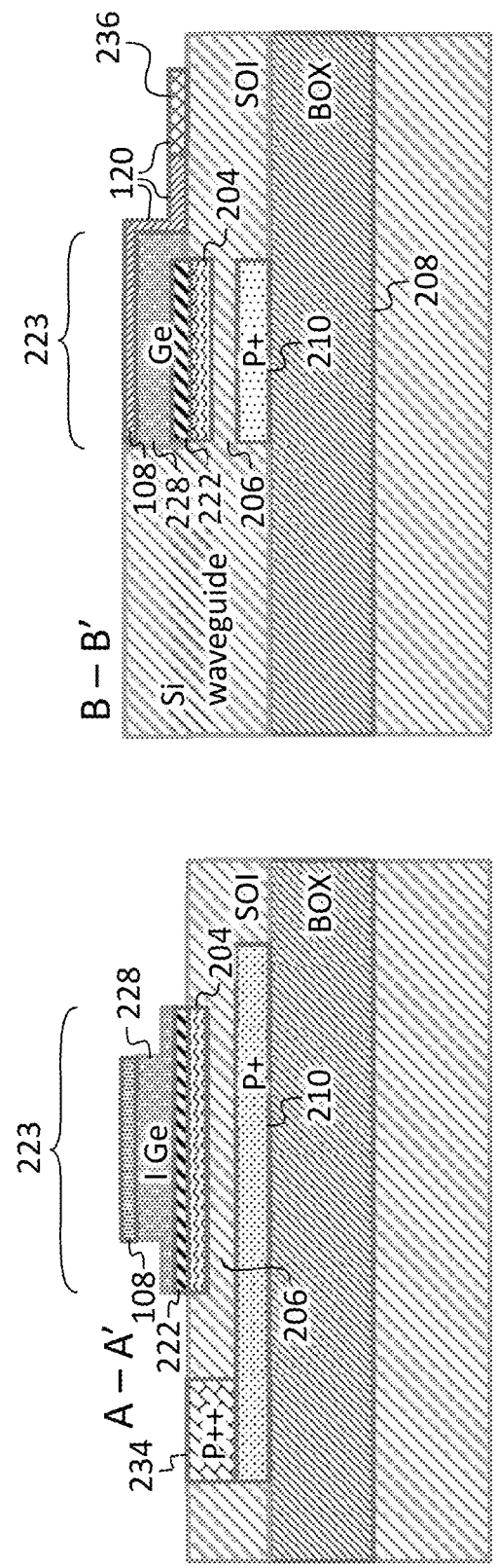

In another embodiment illustrated in FIGS. 11A-11C, the avalanche photodiode includes, like the embodiment of FIG. 1, a silicon waveguide 114 having a tapered region 116. The tapered region 116 may couple light from the silicon waveguide 114 into a germanium waveguide 110 that is part of the avalanche photodiode stack 223 (FIGS. 11B and 11C, discussed in further detail below). Electrical connections may be made to the avalanche photodiode using two metal electrodes (which are not shown in FIGS. 11A-11C, and which may be similar to those shown in FIG. 1) that may be in contact with an N++ doped electrode contact 224 and a P++ doped electrode contact 226 (through via openings in a SiO2 cladding layer (not shown) that may cover the device). The P++ doped electrode contact 226 may be connected to the upper doped germanium region 108 by a top-of-stack connector 120 (FIG. 11C) which may have, as shown, (i) a portion in the silicon device layer, (ii) a horizontal portion extending over the top of the silicon surface next to the avalanche photodiode stack 223 and (iii) a vertical portion extending from the horizontal portion to the upper doped germanium region 108 (for ease of illustration, the portion in the silicon device layer and the horizontal portion extending over the top of the silicon surface next to the avalanche photodiode stack 223 are not illustrated separately in FIG. 11A; instead a single rectangle is shown).

FIGS. 11B and 11C, which are cross-sectional views taken along the section lines A-A' and B-B' of FIG. 11A, respectively, show the avalanche photodiode stack 223, which may be formed on the BOX layer 208 of the SOI wafer, and which may include a lower doped silicon region 210 (or "Si N+ contact"), a silicon multiplication region 206 (which may be un-doped, or intrinsic) above the lower doped silicon region 210, an intermediate doped silicon region 204 (which may be P doped) above the silicon multiplication region 206, a doped germanium interface layer 222 (which may be P doped) above the intermediate doped silicon region 204, an intrinsic (i.e., un-doped, or not intentionally doped) germanium absorption region 228 above the doped germanium interface layer 222, and an upper doped germanium region 108 (which may be P+ doped) above the un-doped germanium absorption region 228. The doped germanium interface layer 222, the intrinsic germanium absorption region 228 and the upper doped germanium region 108 may together form the germanium waveguide 110, which may be a rib waveguide, as shown.

The embodiment of FIGS. 10A-10B may be may be fabricated, starting from a silicon on insulator wafer, in a manner similar to that shown in FIGS. 6A(i)-6T(ii), differing from the process of FIGS. 6A(i)-6T(ii) for example in that a first portion of the epitaxial growth of germanium (which results in the intermediate structure of FIGS. 6N(i) and 6N(ii) may be performed with in-situ doping, to create the doped germanium interface region 222.

The embodiment of FIGS. 11A-11C may also be fabricated, starting from a silicon on insulator wafer, in a manner similar to that shown in FIGS. 6A(i)-6T(ii). For example, the method may include (i) etching, using a hard mask, a cavity in the device layer of the SOI wafer, leaving, at the bottom of the cavity, over the BOX layer, a layer of silicon having the thickness of the lower doped silicon region 210, (ii) doping the layer of silicon at the bottom of the cavity (e.g., using ion implantation) to form the lower doped silicon region 210, (iii) growing, using epitaxy, an additional layer of intrinsic silicon in the cavity, on the lower doped silicon region 210, (iv) doping a first portion of the additional layer (e.g., using ion implantation) to form the N++ doped electrode contact 224 and doping a second portion of the additional layer (e.g., using ion implantation) to form the intermediate doped silicon region 204 (and, in the embodiment of FIGS. 11A-C and 13A-C, the silicon portion of the top-of-stack connector 120), (v) growing a region of germanium to fill the remainder of the cavity to approximately the same depth as the original thickness of the device layer, (vi) using chemical-mechanical polishing (CMP) to make the top surface of the grown material flat and flush with the top surface of the surrounding hard mask, (vii) etching the germanium to form the profile of the rib waveguide in the germanium and of the top-of-stack connector 120, and (viii) doping (e.g., using ion implantation) the upper surface and one wall of the germanium structure to form the upper doped germanium region 108 and the top-of-stack connector 120. The silicon waveguide may also be formed by etching (e.g., when the rib waveguide is formed in the germanium structure) and the N++ doped electrode contact 224 and P++ doped electrode contact 226 may be formed, e.g., by ion implantation. Several different methods may be used to form the doped germanium interface region 222. For example, the step of growing a region of germanium to fill the remainder of the cavity to approximately the same depth as the original thickness of the device layer may include (i) growing a thin (e.g., 100 nm thick) layer of Ge, (ii) doping a portion of the thin layer of Ge, and (iii) growing additional Ge to fill the cavity with Ge. The doping of a portion of the thin layer of Ge may be done (i) by performing high temperature in-situ annealing at 850° C.-900° C., during which the dopant (e.g., boron) in the intermediate doped silicon region 204 diffuses into the thin layer of Ge, or (ii) by (a) masking off a portion of the thin layer of Ge, (b) doping the remainder of the thin layer of Ge using ion implantation, and (c) removing the mask. As another example, high temperature annealing at 850° C.-900° C. may be used (after the step of growing the region of germanium to fill the remainder of the cavity to approximately the same depth as the original thickness of the device layer) to cause the dopant in the intermediate doped silicon region 204 to diffuse a small distance into the bottom of the Ge region.

Table 1 below shows a range of thicknesses for each of several elements of the avalanche photodiode.

TABLE 1

| Element | Thickness range |
|---|---|
| Ge—P+ contact 226 | 100 nm-200 nm |
| Ge-intrinsic (not intentionally doped) 228 | 0.4 nm-0.6 um |
| Ge—P interface layer 222 | 50 nm-100 nm |
| Si—P charge layer 204 | 50 nm-100 nm |
| Si Multiplication region 206 | 100 nm-200 nm |
| Si N+ contact | 100 nm-200 nm |

The embodiment of FIGS. 12A-12C is similar to the embodiment of FIGS. 11A-11C, differing from the latter in that the P++ doped electrode contact 226 is in germanium instead of being in silicon, and in that the top-of-stack connector 120 does not have a portion in the silicon device layer.

The embodiments of FIGS. 13A-14C are analogous to those of FIGS. 11A-12C; the embodiments of FIGS. 13A-14C differ from those of FIGS. 11A-12C in that the doping polarities are reversed. Accordingly, in the embodiments of FIGS. 13A-14C the upper doped germanium region 108 and the top-of-stack connector 120 are N+ doped, the doped germanium interface layer 222 is N doped, the intermediate doped silicon region 204 is N doped, and the lower doped silicon region 210 is P+ doped. A P++ doped electrode contact 234 is used to make a connection from a metal electrode (not shown) to the lower doped silicon region 210 and an N++ doped electrode contact 236 is used to make a connection from another metal electrode (not shown) to the upper doped germanium region 108.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

LIST OF FEATURES

100 Avalanche photodiode
102 N+ doped region extending to reach electrode
104 First electrode
106 Second electrode
906 Second electrode
108 Upper P+ doped region/upper doped germanium region
808 Upper P+ doped region
110 Germanium rib waveguide
112 Germanium rib waveguide/silicon taper waveguide interface
114 Input waveguide
116 Tapered region of the input waveguide
118 Input light
120 Top-of-stack connector
150 Vertical direction (into the plane of the device)
152 First transversal direction
154 Second transversal direction
202 Cladding layer
204 Intermediate P doped region/intermediate doped silicon region
206 Multiplication region
208 Buried oxide layer
210 Lower N+ doped region/lower doped silicon region
212 Substrate
220 Silicon slab
222 Doped germanium interface region
223 Avalanche photodiode stack
224 N++ doped electrode contact
226 P++ doped electrode contact
228 Un-doped germanium absorption region
234 P++ doped electrode contact
236 N++ doped electrode contact
302 Lower N+ doped region
404 Intermediate N doped region
408 Upper N+ doped region
410 Lower P+ doped region
414 P+ doped region extending to reach electrode
510 Lower P+ doped region
514 P+ doped region extending to reach electrode
602 Silicon-on-insulator layer
606 Cavity
604 Hard mask
608 Cover layer
610 Lined cavity sidewall
612 Cavity bed
614 Epitaxially grown silicon layer
616 Dopants 618 Photoresist
620 Lower N+ doped region
622 Undoped epitaxially grown silicon region
624 Further epitaxially grown silicon layer
626 Dopants
628 Second photoresist
629 Implantation window in photoresist
631 Third photoresist
632 Undoped multiplication region
633 Dopants
634 Intermediate P doped region
636 Epitaxially grown germanium layer
637 Implantation window in third photoresist
638 Planarized germanium layer
640 Fourth photoresist
642 First germanium waveguide slab
644 Second germanium waveguide slab
648 Germanium waveguide rib
650 Third germanium waveguide slab
652 Fifth photoresist
654 Exposed N+ doped region
656 Mask layer
658 Sixth photoresist
660 Dopants
702 N+ doped region extending across the width of the cavity As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second quantity is "within Y" of a first quantity X, it means that the second quantity is at least X-Y and the second quantity is at most X+Y. As used herein, when a second number is "within Y%" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items. As used herein, any structure or layer that is described as being "made of" or "composed of" a substance should be understood (i) in some embodiments, to contain that substance as the primary component or (ii) in some embodiments, to contain that substance as the major component.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "1.0-10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Similarly, a range described as "within 35% of 10" is intended to include all subranges between (and including) the recited minimum value of 6.5 (i.e., (1−35/100) times 10) and the recited maximum value of 13.5 (i.e., (1+35/100) times 10), that is, having a minimum value equal to or greater than 6.5 and a maximum value equal to or less than 13.5, such as, for example, 7.4 to 10.6. Any maximum numerical limitation recited herein is intended to include all lower numerical limitations subsumed therein and any minimum numerical limitation recited in this specification is intended to include all higher numerical limitations subsumed therein.

Although exemplary embodiments of a avalanche photodiode structure have been specifically described and illustrated herein, many modifications and variations will be apparent to those skilled in the art. Accordingly, it is to be understood that a avalanche photodiode structure constructed according to principles of this disclosure may be embodied other than as specifically described herein. The invention is also defined in the following claims, and equivalents thereof.

What is claimed is:

1. A germanium based avalanche photodiode device, the germanium based avalanche photodiode device including:
   a silicon substrate;
   a buried oxide layer, above the silicon substrate;
   a lower doped silicon region, above the buried oxide layer;
   a silicon multiplication region, above the lower doped silicon region;
   an intermediate doped silicon region, above the silicon multiplication region;
   a doped germanium interface layer, above the intermediate doped silicon region;
   an un-doped germanium absorption region, above the intermediate doped silicon region;
   an upper doped germanium region, above the un-doped germanium absorption region;
   an input silicon waveguide; a first electrode; and a second electrode,
   wherein: the un-doped germanium absorption region and the upper doped germanium region form a germanium waveguide which is coupled to the input silicon waveguide,
   the first electrode extends laterally to contact the lower doped silicon region, and
   the second electrode extends laterally to contact the upper doped germanium region.

2. The germanium based avalanche photodiode device of claim 1, wherein the doped germanium interface layer has a thickness between 30 nm and 200 nm.

3. The germanium based avalanche photodiode device of claim 1, wherein the lower doped silicon region includes a part which extends away from the buried oxide layer so as to contact the first electrode.

4. The germanium based avalanche photodiode device of claim 1, wherein the input silicon waveguide and germanium waveguide are rib waveguides.

5. The germanium based avalanche photodiode device of claim 1, wherein the germanium waveguide has a first lateral edge, and the lower doped silicon region is coterminous in lateral extension with the first lateral edge of the germanium waveguide.

6. The germanium based avalanche photodiode device of claim 1, wherein the germanium waveguide has a first lateral edge, and the lower doped silicon region extends laterally beyond the first lateral edge of the germanium waveguide.

7. The germanium based avalanche photodiode device of claim 1, wherein the multiplication silicon region, the germanium waveguide, and the intermediate doped silicon region are within a cavity of a silicon-on-insulator layer.

8. The germanium based avalanche photodiode device of claim 1, wherein the multiplication silicon region is between 50 nm and 150 nm thick.

9. The germanium based avalanche photodiode device of claim 1, wherein the upper doped germanium region and the lower doped silicon region are heavily doped as compared to the intermediate doped silicon region.

10. The germanium based avalanche photodiode device of claim 1, wherein the intermediate doped silicon region is doped with dopants of a same species as the upper doped germanium region.

11. The germanium based avalanche photodiode device of claim 1, wherein a top surface of the input silicon waveguide is substantially aligned with a top surface of the germanium waveguide.

12. A method of fabricating a germanium based avalanche photodiode device, comprising:
    providing a silicon substrate and an insulator layer, above which is a silicon-on-insulator layer;
    etching the silicon-on-insulator layer, to form a cavity of the silicon-on-insulator layer, the bottom of which includes a first silicon layer on the insulator layer;
    doping the first silicon layer to form a lower doped silicon region;
    growing a second silicon layer from an upper surface of the lower doped silicon region;
    doping a first part of the second silicon layer to form an intermediate doped silicon region;
    epitaxially growing a germanium layer from an upper surface of the second silicon layer to form a germanium waveguide,
    the growing comprising using in-situ doping to form a doped germanium interface layer on the intermediate doped silicon region;
    doping a part of the germanium layer to form an upper doped germanium region; and
    providing a first electrode and a second electrode, the first electrode contacting the lower doped silicon region and the second electrode contacting the upper doped germanium region.

13. The method of claim 12, further including a step of:
    after etching the silicon-on-insulator layer and before epitaxially growing the first silicon layer: disposing an insulating layer along sidewalls and the bed of the cavity.

14. The method of claim 13, including the step of:
    etching the insulating layer which is along the bed of the cavity, thereby leaving an insulating layer along the sidewalls of the cavity.

15. The method of claim 12, including the step of doping a region of the first silicon layer.

16. The method of claim 12, wherein the doped germanium interface layer has a thickness between 30 nm and 200 nm.

17. The method of claim 12, including the step of:
    etching a part of the germanium layer, to thereby provide a rib waveguide having one or more slab regions.

18. The method of claim 12, including the step of:
    before the doping of the part of the germanium layer:
        disposing a photoresist over a part of an upper most surface of the partially fabricated germanium based avalanche photodiode device;
    and after doping the part of the germanium layer:
        removing the photoresist.

19. The method of claim 13, further including a step of:
    annealing the partially fabricated germanium based avalanche photodiode device.

20. The method of claim 13, further including a step of:
    disposing a cladding layer over the partially fabricated germanium based avalanche photodiode device.

* * * * *